(12) United States Patent
Inoue et al.

(10) Patent No.: US 10,924,085 B2
(45) Date of Patent: Feb. 16, 2021

(54) GUIDED ACOUSTIC WAVE DEVICE

(71) Applicant: Qorvo US, Inc., Greensboro, NC (US)

(72) Inventors: Shogo Inoue, Longwood, FL (US);
Marc Solal, Longwood, FL (US)

(73) Assignee: Qorvo US, Inc., Greensboro, NC (US)

(*) Notice: Subject to any disclaimer, the term of this patent is extended or adjusted under 35 U.S.C. 154(b) by 537 days.

(21) Appl. No.: 15/785,760

(22) Filed: Oct. 17, 2017

(65) Prior Publication Data
US 2018/0109241 A1 Apr. 19, 2018

Related U.S. Application Data

(60) Provisional application No. 62/409,066, filed on Oct. 17, 2016.

(51) Int. Cl.
| | |
|---|---|
| *H03H 9/25* | (2006.01) |
| *H03H 9/64* | (2006.01) |
| *H03H 9/02* | (2006.01) |
| *H03H 9/145* | (2006.01) |

(52) U.S. Cl.
CPC ...... *H03H 9/6413* (2013.01); *H03H 9/02551* (2013.01); *H03H 9/02559* (2013.01); *H03H 9/02566* (2013.01); *H03H 9/02574* (2013.01); *H03H 9/02669* (2013.01); *H03H 9/14541* (2013.01); *H03H 9/25* (2013.01)

(58) Field of Classification Search
CPC ............. H03H 9/6413; H03H 9/02551; H03H 9/02559; H03H 9/02566; H03H 9/02574; H03H 9/02669; H03H 9/14541
USPC ...................... 310/313 A–313 D, 313 R, 360
See application file for complete search history.

(56) References Cited

U.S. PATENT DOCUMENTS

| | | | | |
|---|---|---|---|---|
| 3,601,639 | A * | 8/1971 | Hannon | H03H 9/02031 310/360 |
| 4,016,440 | A * | 4/1977 | Wagers | H01L 41/18 310/313 A |
| 6,445,265 | B1 | 9/2002 | Wright | |
| 9,431,996 | B2 | 8/2016 | Watanabe et al. | |
| 2005/0146243 | A1* | 7/2005 | Cherednick | G01K 11/265 310/313 A |
| 2007/0216261 | A1* | 9/2007 | Higuchi | H01L 41/187 310/358 |

(Continued)

OTHER PUBLICATIONS

Author Unknown, "An American National Standard: IEEE Standard on Piezoelectricity," ANSI/IEEE Std 176-1987, Sponsored by the Standards Committee of the IEEE Ultrasonics, Ferroelectrics, and Frequency Control Society, The Institute of Electrical and Electronics Engineers, Inc., Copyright 1988, 74 pages.

(Continued)

*Primary Examiner* — Thomas M Dougherty
(74) *Attorney, Agent, or Firm* — Withrow & Terranova, P.L.L.C.

(57) ABSTRACT

A guided acoustic wave device includes a substrate, a lithium tantalate layer on the substrate, and a transducer on the lithium tantalate film. The lithium tantalate has a crystalline orientation defined by (YX1)Θ°, where Θ is between 10° and 37°. The inventors discovered that limiting the crystalline orientation of the lithium tantalate in this manner provides significant increases in the electromechanical coupling coefficient of the acoustic wave device, thereby increasing bandwidth and improving performance.

23 Claims, 23 Drawing Sheets

(56) References Cited

U.S. PATENT DOCUMENTS

| | | | |
|---|---|---|---|
| 2012/0194032 A1 | 8/2012 | Kadota | |
| 2013/0285768 A1 | 10/2013 | Watanabe et al. | |
| 2017/0033756 A1 | 2/2017 | Inoue et al. | |
| 2017/0033764 A1 | 2/2017 | Inoue et al. | |
| 2017/0222618 A1 | 8/2017 | Inoue et al. | |
| 2017/0222622 A1 | 8/2017 | Solal et al. | |
| 2018/0006629 A1* | 1/2018 | Tanno | H03H 3/08 |
| 2018/0080144 A1* | 3/2018 | Tanno | C04B 37/00 |
| 2018/0102760 A1 | 4/2018 | Inoue et al. | |
| 2018/0109242 A1 | 4/2018 | Solal et al. | |
| 2018/0152170 A1* | 5/2018 | Iwamoto | H03H 9/72 |

OTHER PUBLICATIONS

Iwamoto, H., et al., "A Novel SAW Resonator with Incredible High-Performances," 2017 IEEE International Meeting for Future of Electron Devices, Jun. 29-30, 2017, Kyoto, Japan, 2 pages.

Pastureaud, T., et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Solal, M., et al., "Oriented lithium niobate layers transferred on 4' [100] silicon wafer for RF SAW devices," Proceedings of the 2002 IEEE International Ultrasonics Symposium, Oct. 8-11, 2002, Munich, Germany, pp. 131-134.

Takai, T., et al., "Incredible High Performance SAW resonator on Novel Multi-layerd Substrate," 2016 IEEE International Ultrasonics Symposium, Sep. 18-21, 2016, Tours, France, 4 pages.

Takai, T., et al., "I.H.P. SAW technology and its application to micro acoustic components," 2017 IEEE International Ultrasonics Symposium, Sep. 6-9, 2017, Washington, D.C., USA, 8 pages.

Non-Final Office Action for U.S. Appl. No. 15/784,592, dated Apr. 13, 2020, 6 pages.

Notice of Allowance for U.S. Appl. No. 151784,592, dated Jul. 22, 2020, 7 pages.

* cited by examiner

GUIDED ACOUSTIC WAVE DEVICE

RELATED APPLICATIONS

This application claims the benefit of provisional patent application Ser. No. 62/409,066, filed Oct. 17, 2016, the disclosure of which is hereby incorporated herein by reference in its entirety.

FIELD OF THE DISCLOSURE

The present disclosure relates to guided acoustic wave devices, and in particular to piezoelectric materials for guided acoustic wave devices with crystalline orientations configured to improve the performance of the guided acoustic wave device.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of RF signals for communication. Due to the stringent demands placed on filters for modern RF communication systems, acoustic wave devices for these applications must provide high quality factor, low loss, wide bandwidth (i.e., high electromechanical coupling coefficient), and favorable temperature coefficient of frequency. Further, as modern RF communication systems utilize an increasing number of RF communication bands and aggregate bandwidth for improved throughput, it is desirable for acoustic wave devices for these applications to have a high bandwidth. Often, undesired oscillations or vibrations are transduced in the piezoelectric material of an acoustic wave device which degrade these characteristics. These undesired oscillations or vibrations are often referred to as spurious modes. There is a need for acoustic wave devices with reduced spurious modes such that the acoustic wave devices provide high quality factor, low loss, favorable temperature coefficient of frequency, and high bandwidth.

SUMMARY

The present disclosure relates to guided acoustic wave devices, and in particular to piezoelectric materials for guided acoustic wave devices with crystalline orientations configured to improve the performance of the guided acoustic wave device. In one embodiment, a guided acoustic wave device includes a substrate, a lithium tantalate layer on the substrate, and a transducer on the lithium tantalate film. The lithium tantalate has a crystalline orientation defined by $(YXl)\Theta°$, where $\Theta$ is between 10° and 37°. The inventors discovered that limiting the crystalline orientation of the lithium tantalate in this manner provides significant increases in the electromechanical coupling coefficient of the acoustic wave device, thereby increasing bandwidth and improving performance.

In one embodiment, the transducer is an interdigital transducer including a first comb electrode and a second comb electrode. The first comb electrode includes a first bus bar and a number of electrode fingers extending transversely from the first bus bar. The second comb electrode includes a second bus bar and a number of electrode fingers extending transversely from the first bus bar such that the first bus bar is parallel to the second bus bar, the first electrode fingers extend from the first bus bar towards the second bus bar, the second electrode fingers extend from the second bus bar towards the first bus bar, and the first electrode fingers are interleaved with the second electrode fingers.

In one embodiment, a distance between adjacent electrode fingers of one of the first comb electrode and the second comb electrode defines a center frequency wavelength ($\lambda$) of the guided acoustic wave device. The thickness of the lithium tantalate layer may be less than $2\lambda$. Limiting the thickness of the lithium tantalate layer in this manner may further increase the electromechanical coupling coefficient and thus bandwidth of the guided acoustic wave device.

In one embodiment, the thickness of the lithium tantalate layer is between $0.10\lambda$, and $0.45\lambda$. In another embodiment, the thickness of the lithium tantalate layer is between $0.15\lambda$ and $0.35\lambda$.

In one embodiment, $\Theta$ is between 10° and 35°. In another embodiment, $\Theta$ is between 15° and 30°.

In one embodiment, the substrate is $(XZl)90°$ quartz. In another embodiment, the substrate is (111) silicon.

In one embodiment, one or more dielectric layers are located between the lithium tantalate layer and the substrate. The one or more dielectric layers may comprise silicon oxide, and may have a thickness less than $2\lambda$.

In one embodiment, a guided acoustic wave device includes a substrate, a lithium tantalate layer on the substrate, and a transducer on the lithium tantalate film. The lithium tantalate has a crystalline orientation defined by $$(YXl)\Theta°, \text{ where } 22 - \frac{1.2h}{\lambda} \leq \Theta \leq 37 + \frac{0.6h}{\lambda} - 0.08\left(\frac{h}{\lambda}\right)^2.$$

The inventors discovered that limiting the crystalline orientation of the lithium tantalate in this manner provides significant increases in the electromechanical coupling coefficient of the acoustic wave device, thereby increasing bandwidth and improving performance.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
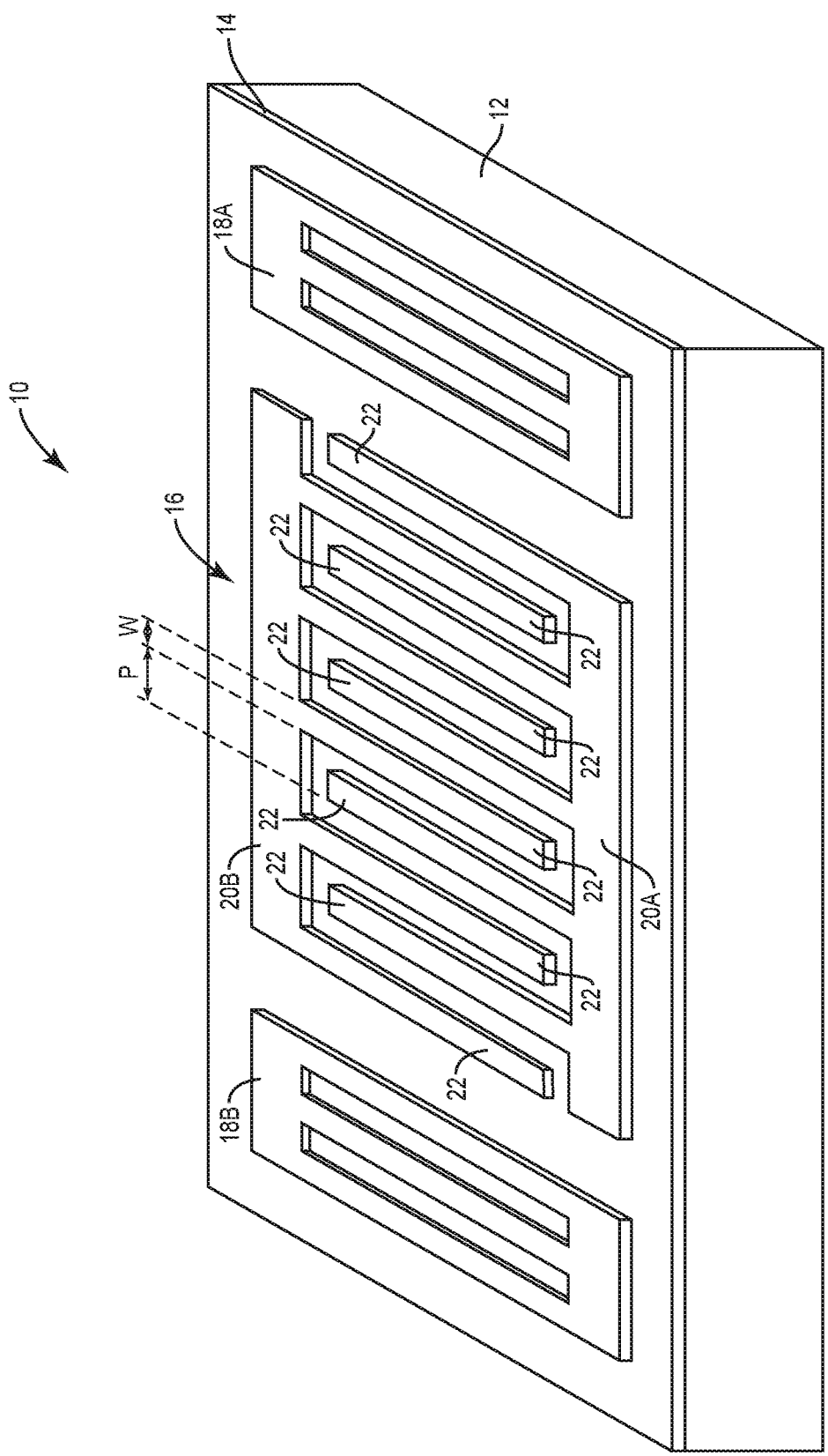
FIG. 1 illustrates a guided acoustic wave device according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows details of a guided acoustic wave device 10 according to one embodiment of the present disclosure. The guided acoustic wave device 10 includes a substrate 12, a piezoelectric layer 14 on the substrate 12, an interdigital transducer 16 on a surface of the piezoelectric layer 14 opposite the substrate 12, a first reflector structure 18A on the surface of the piezoelectric layer 14 adjacent to the interdigital transducer 16, and a second reflector structure 18B on the surface of the piezoelectric layer 14 adjacent to the interdigital transducer 16 opposite the first reflector structure 18A.

The interdigital transducer 16 includes a first comb electrode 20A and a second comb electrode 20B, each of which include a number of electrode fingers 22 that are interleaved with one another as shown. A lateral distance between adjacent electrode fingers 22 of the first comb electrode 20A and the second comb electrode 20B defines an electrode pitch P of the interdigital transducer 16. The electrode pitch P may at least partially define a center frequency wavelength $\lambda$ of the guided acoustic wave device 10, where the center frequency is the primary frequency of mechanical waves generated in the piezoelectric layer 14 by the interdigital transducer 16. For a single electrode interdigital transducer 16 such as the one shown in FIG. 1, the center frequency wavelength $\lambda$ is equal to twice the electrode pitch P. For a double electrode interdigital transducer 16, the center frequency wavelength $\lambda$ is equal to four times the electrode pitch P. A finger width W of the adjacent electrode fingers 22 over the electrode pitch P may define a metallization ratio M of the interdigital transducer 16, which may dictate certain operating characteristics of the guided acoustic wave device 10.

In operation, an alternating electrical input voltage provided between the first comb electrode 20A and the second comb electrode 20B is transduced into a mechanical signal in the piezoelectric layer 14, resulting in one or more acoustic waves therein. In the case of the guided acoustic wave device 10, the resulting acoustic waves are predominately surface acoustic waves. As discussed above, due to the electrode pitch P and the metallization ratio M of the interdigital transducer 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in amplitude and phase of the impedance seen between the first comb electrode 20A and the second comb electrode 20B with respect to the frequency of the alternating electrical input signal. The acoustic waves transduced by the alternating electrical input signal travel in the piezoelectric layer 14, eventually being transduced back into an alternating electrical output signal. The first reflector structure 18A and the second reflector structure 18B reflect the acoustic waves in the piezoelectric layer 14 back towards the interdigital transducer 16 to confine the acoustic waves in the area surrounding the interdigital transducer 16.

Figure 2:
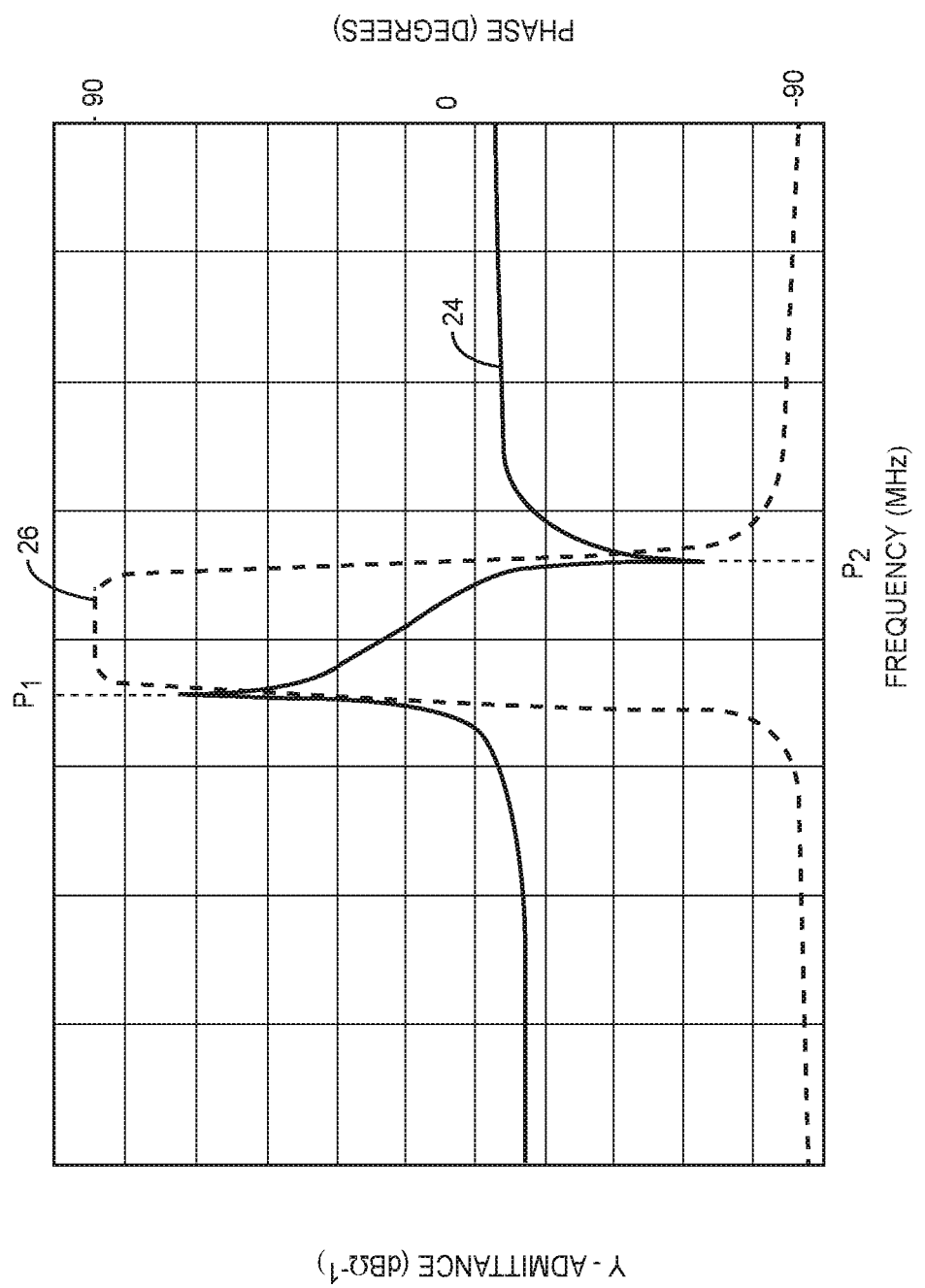
FIG. 2 is a graph illustrating the operation of an ideal acoustic wave device according to one embodiment of the present disclosure.

FIG. 2 is a graph illustrating an ideal relationship of the impedance (shown as the admittance amplitude) and impedance phase between the first comb electrode 20A and the second comb electrode 20B to the frequency of the alternating electrical input signal for the guided acoustic wave device 10. A solid line 24 illustrates the admittance amplitude between the first comb electrode 20A and the second comb electrode 20B with respect to the frequency of the alternating electrical input signal. Notably, the solid line 24 includes a peak at a first point P1 at which the admittance between the first comb electrode 20A and the second comb electrode 20B climbs rapidly to a maximum value. This peak occurs at the series resonant frequency ($f_s$) of the guided acoustic wave device 10. The impedance between the first comb electrode 20A and the second comb electrode 20B is minimal at the series resonant frequency ($f_s$), such that the first comb electrode 20A and the second comb electrode 20B appear as a short-circuit. The solid line 24 also includes a valley at a second point P2 at which the admittance between the first comb electrode 20A and the second comb electrode 20B plummets rapidly to a minimum value. This valley occurs at the parallel resonant frequency ($f_p$) of the guided acoustic wave device 10. The impedance between the first comb electrode 20A and the second comb electrode 20B is at a maximum at the parallel resonant frequency ($f_p$), such that the first comb electrode 20A and the second comb electrode 20B appear as an open circuit.

A dashed line 26 illustrates the phase of the impedance between the first comb electrode 20A and the second comb electrode 20B with respect to the frequency of the alternating electrical input signal. Notably, the dashed line shows that a 90° phase shift occurs between the series resonant frequency ($f_s$) and the parallel resonant frequency ($f_p$). This phase shift is due to the change in the impedance from primarily capacitive to primarily inductive between the series resonant frequency ($f_s$) and the parallel resonant frequency ($f_p$).

The graph shown in FIG. 2 is highly idealized. In reality, the response of the guided acoustic wave device 10 includes spurious areas that degrade the performance thereof as discussed above. In an effort to idealize the response of the guided acoustic wave device 10, several parameters of the device may be changed, such as the thickness of the metal for the interdigital transducer 16 and the reflector structures 18, the arrangement of the interdigital transducer 16 (i.e., the electrode pitch P and the finger width W), the material of the piezoelectric layer 14, the thickness of the piezoelectric layer 14, the crystalline orientation of the piezoelectric layer 14, the material of the substrate 12, and the crystalline orientation of the substrate 12. Changing each of these parameters may affect the performance of the guided acoustic wave device 10 in several ways. For example, specific combinations of these parameters may change an electromechanical coupling coefficient of the guided acoustic wave device 10.

Figure 3C:
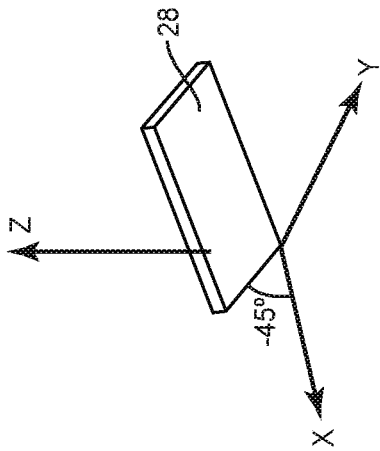
FIGS. 3A through 3C illustrate the rotation of a thin wafer and the description of the crystalline orientation thereof according to one embodiment of the present disclosure.
Figure 3B:
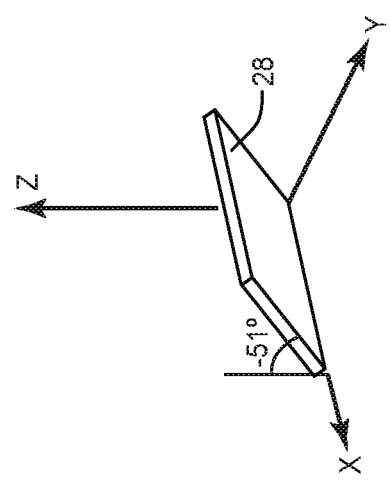
Figure 3A:
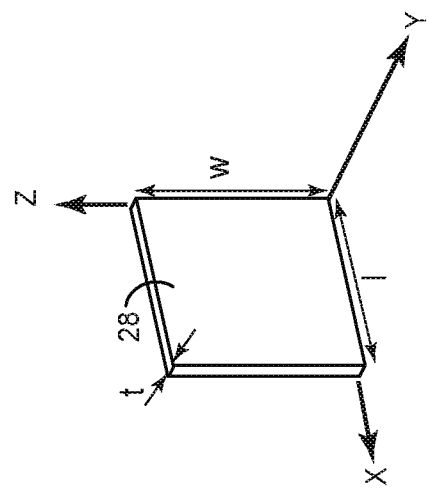

One way to describe the crystalline orientation of a material is using IEEE notation as described in IEEE Standard 176-1987, the contents of which are hereby incorporated by reference in their entirety. IEEE notation is commonly used to describe the crystalline orientation of thin wafers. The dimensions of a thin wafer are defined by a thickness t, a length l, and a width w. IEEE notation describes the rotation of the thin wafer about the thickness t, the length l, and the width w with respect to a set of orthogonal axes X, Y, and Z, where the set of orthogonal axes X, Y, and Z are related to crystallographic axes of the material of the thin wafer according to well-known principles of crystallography. IEEE notation takes the form of (ABlwt)$\Phi°/\Theta°/\Psi°$, where A is the one of the orthogonal axes (X, Y, or Z) along which the thickness t of the thin wafer is oriented, B is the one of the orthogonal axes (X, Y, or Z) along which the length l of the thin wafer is oriented, $\Phi°$ is the amount of rotation of the thin wafer about the axis described by the length l, $\Theta°$ is the amount of rotation of the thin wafer about the axis described by the width w, and $\Psi°$ is the amount of rotation of the thin wafer about the axis described by the thickness t. For example, (YXlt)−51°/−45° describes a thin wafer where the thickness t is oriented along an Y axis, the length l is oriented along an X axis, and the thin wafer is first rotation −51° about an axis defined by the length l and then rotated −45° about an axis defined by the thickness t. This example is illustrated in FIGS. 3A through 3C. FIG. 3A illustrates a thin wafer 28 defined by a thickness t, a length l, and a width w. The thickness t is oriented along a Y axis and the width w is oriented along an X axis as shown. FIG. 3B shows the thin wafer 28 rotated −51° about the axis defined by the length l. FIG. 3C shows the thin wafer 28 with an additional rotation of −45° about the axis defined by the thickness t. Such rotations define the crystalline orientation within the thin wafer 28, which as discussed above may define one or more characteristics thereof. An angle is positive if the rotation is counterclockwise looking down the positive end of the axis toward the origin. In the previous example the first rotation of −51° is then a clockwise rotation when looking from the positive side of the X axis. The IEEE standard is mostly focused on bulk acoustic wave devices for which the main consideration is the direction of the thickness. In the case of SAW devices, it is necessary to define the direction of propagation and on which face of the crystal the surface wave propagates. In the following, the propagation is done along the long side axis (l). That is, it is along the X axis for all the disclosed orientations. The simulations discussed below were done assuming the normal is oriented toward the surface, but the orientation of the surface does not impact significantly the result.

As discussed above, it is desirable to maximize the bandwidth of the guided acoustic wave device 10. To do so, it is necessary to maximize the electromechanical coupling coefficient thereof. The electromechanical coupling is highly dependent on the orientation of the piezoelectric layer 14. To maximize the electromechanical coupling, the material, thickness, and crystalline orientation of the piezoelectric layer 14 may be specifically chosen to do so. The inventors discovered that a film of lithium tantalate with a crystalline orientation defined by (YXl)$\Theta°$ where $\Theta$ is between 10° and 37° and a thickness less than 2λ was suitable for maximizing the electromechanical coupling coefficient of the guided acoustic wave device 10. In some embodiments, $\Theta$ may be between 10° and 35°, or between 15° and 30°. The inventors discovered that lithium tantalate having a crystalline orientation fitting these parameters maximized the electromechanical coupling coefficient of the guided acoustic wave device 10. Further, thicknesses of the lithium tantalate piezoelectric layer 14 between 0.10, and 0.40λ, and more specifically 0.15λ, and 0.35λ, together with the crystalline orientation discussed above, maximized the electromechanical coupling coefficient. The aforementioned crystalline orientations and thicknesses maximize the electromechanical coupling coefficient when used with any number of different substrates. Specifically, the aforementioned crystalline orientations and thicknesses maximize the electromechanical coupling coefficient when used with both silicon and quartz substrates, and in particular for silicon substrates cut along the (111) miller plane (referred to herein as Si(111)) and for quartz substrates in which the propagation of acoustic waves occurs along or near the z-axis thereof (e.g., (XZl)90° Quartz).

The interdigital transducer 16 and the reflector structures 18 may comprise aluminum. A thickness of the interdigital transducer 16 (i.e., the thickness of the metal used to form the parts of the interdigital transducer 16 such as the first comb electrode 20A and the second comb electrode 20B) may affect the electromechanical coupling coefficient of the guided acoustic wave device 10. The aforementioned crystalline orientations and thicknesses for the piezoelectric layer 14 are generally applicable when the thickness of the interdigital transducer is between 0.05λ and 0.10λ. The inventors discovered a relationship between the crystalline orientation of the piezoelectric layer 14 and the thickness of the interdigital transducer 16 in order to improve the electromechanical coupling and thus bandwidth of the guided acoustic wave device 10. By choosing the crystalline orientation of the piezoelectric layer 14 based at least in part on a thickness of the interdigital transducer 16, the bandwidth of the guided acoustic wave device 10 may be improved. In particular, the inventors discovered that for a lithium tantalate film, a crystalline orientation defined by equation (1) provides significant improvements in the bandwidth of the guided acoustic wave device:

$$(YXl)\Theta° \quad (1)$$
$$\text{where } 22 - \frac{1.2h}{\lambda} \leq \Theta \leq 37 + \frac{0.6h}{\lambda} - 0.08\left(\frac{h}{\lambda}\right)^2$$

where h is the thickness of the interdigital transducer 16 and lambda is the wavelength of the primary wave transduced in the piezoelectric layer 14 as discussed above. In equation (1), the relative thickness $$\left(\frac{h}{\lambda}\right)$$

is expressed in percent, and is therefore multiplied by 100.

Figure 4:
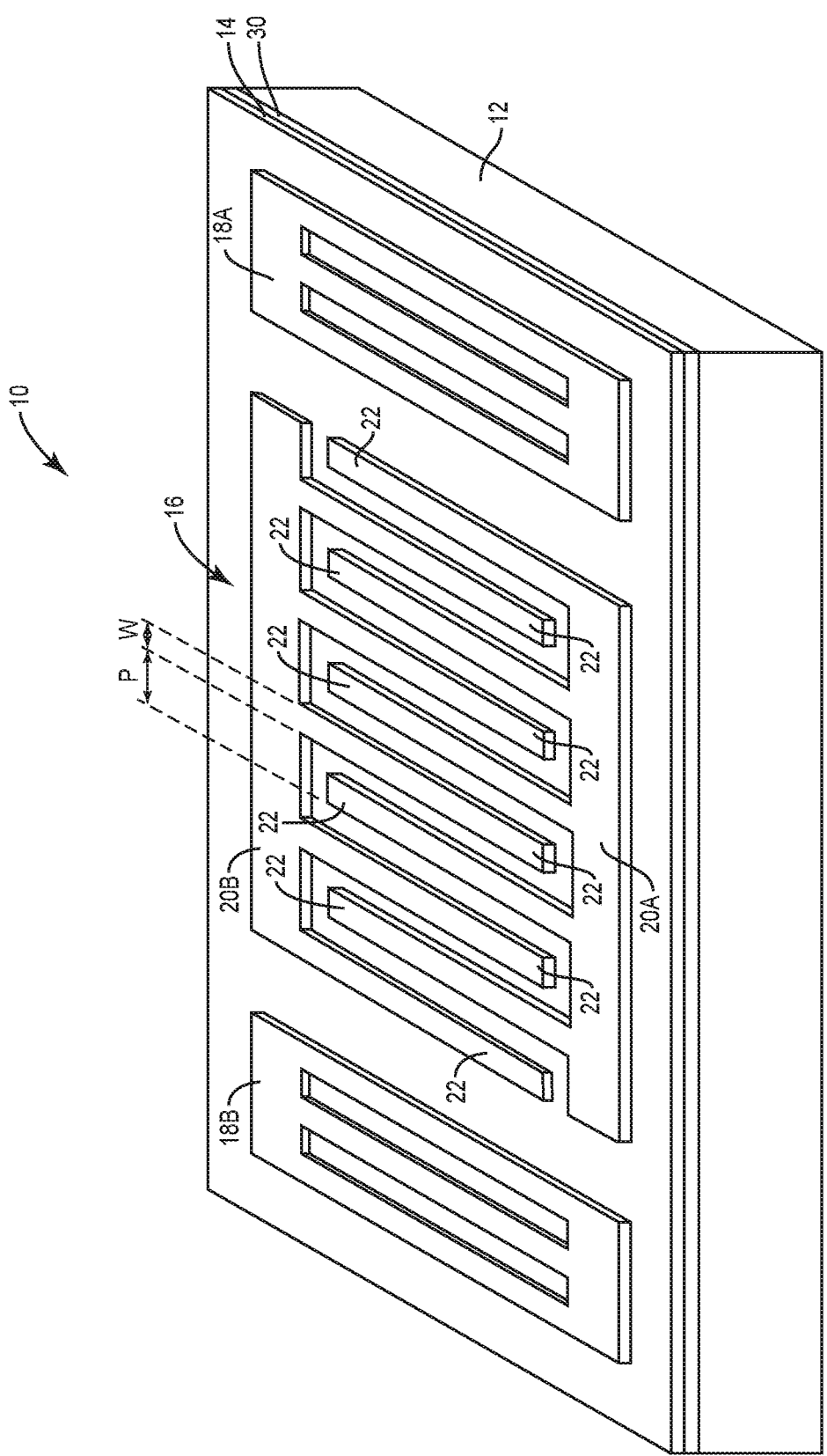
FIG. 4 illustrates a guided acoustic wave device according to one embodiment of the present disclosure.

In addition to the above, the presence or absence of intervening layers such as dielectric layers between the substrate 12 and the piezoelectric layer 14 may also affect the electromechanical coupling coefficient and thus bandwidth of the guided acoustic wave device 10. FIG. 4 shows the guided acoustic wave device 10 further including an intervening layer 30 between the substrate 12 and the piezoelectric layer 14. The aforementioned crystalline orientations and thicknesses for the piezoelectric layer 14 are generally applicable when the thickness of such an intervening layer 30 (e.g., silicon oxide or dioxide) is less than 0.20λ.

Figure 5:
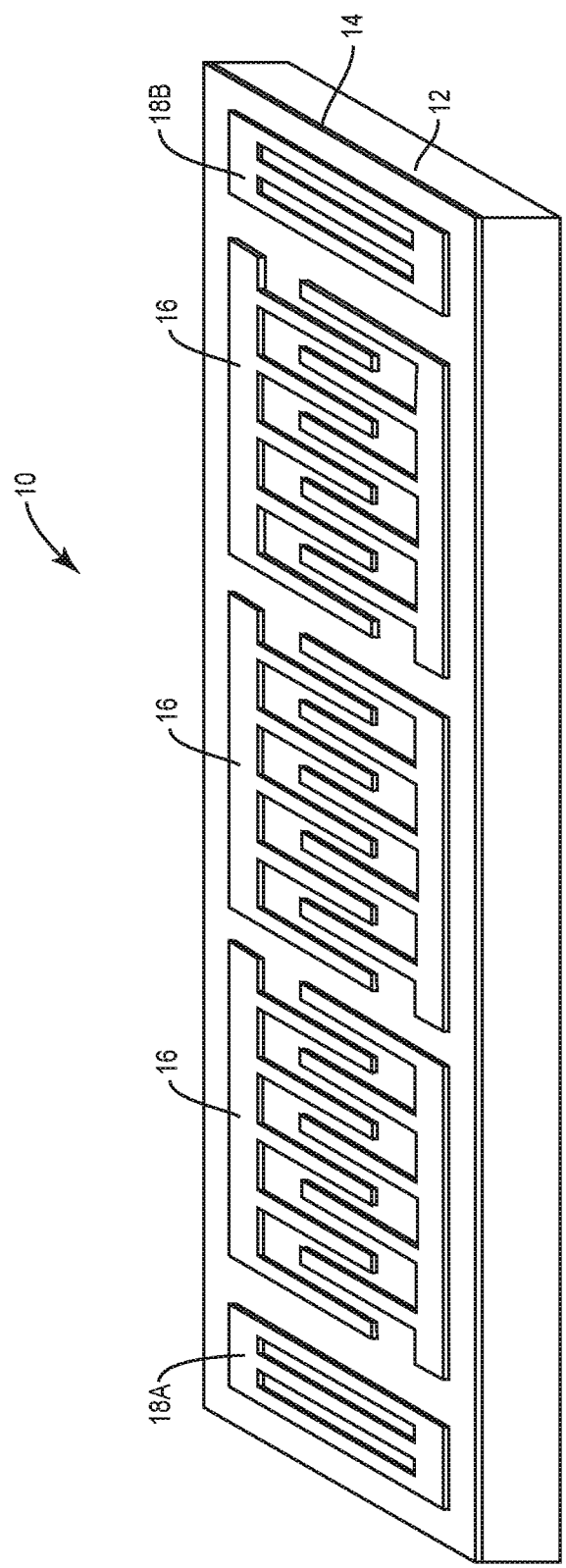
FIG. 5 illustrates a coupled resonator filter (CRF) according to one embodiment of the present disclosure.

FIG. 5 shows the guided acoustic wave device 10 further including additional interdigital transducers 16 such that the guided acoustic wave device 10 forms a coupled resonator filter (CRF). The principles of the present disclosure apply equally to CRF devices and any other acoustic wave devices in the art.

Figure 6A:
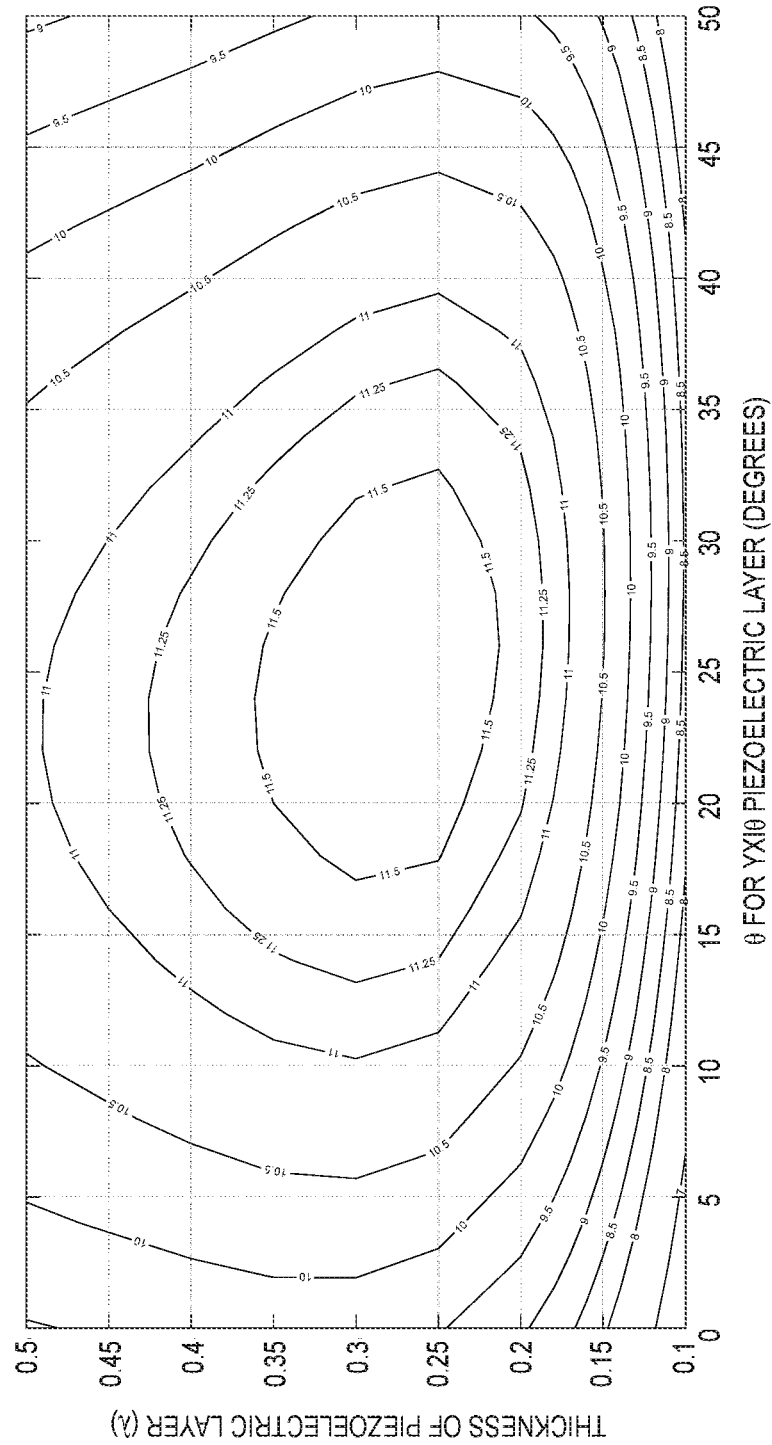
FIGS. 6A through 6R are graphs illustrating the simulated performance of a guided acoustic wave device according to various embodiments of the present disclosure.
Figure 6B:
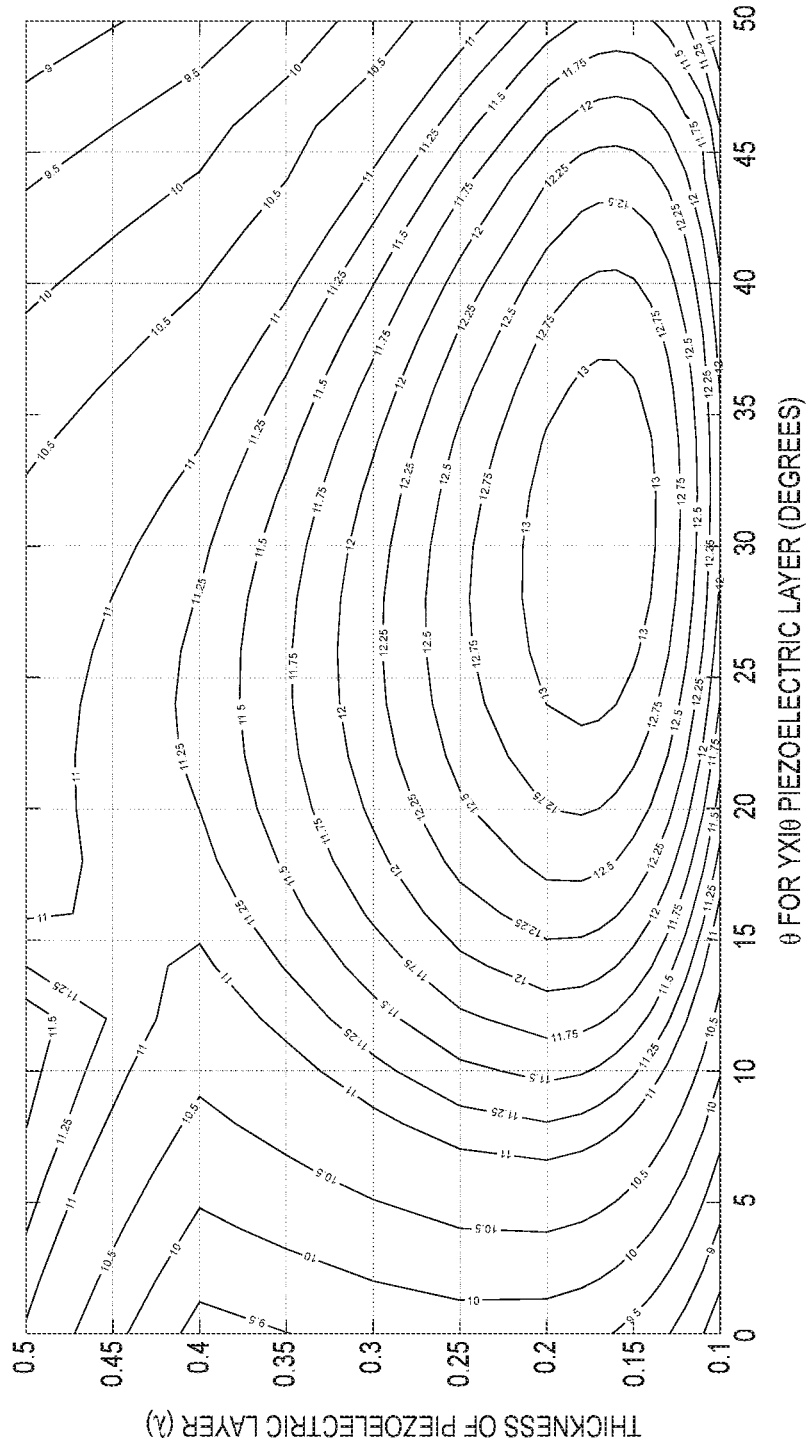
Figure 6C:
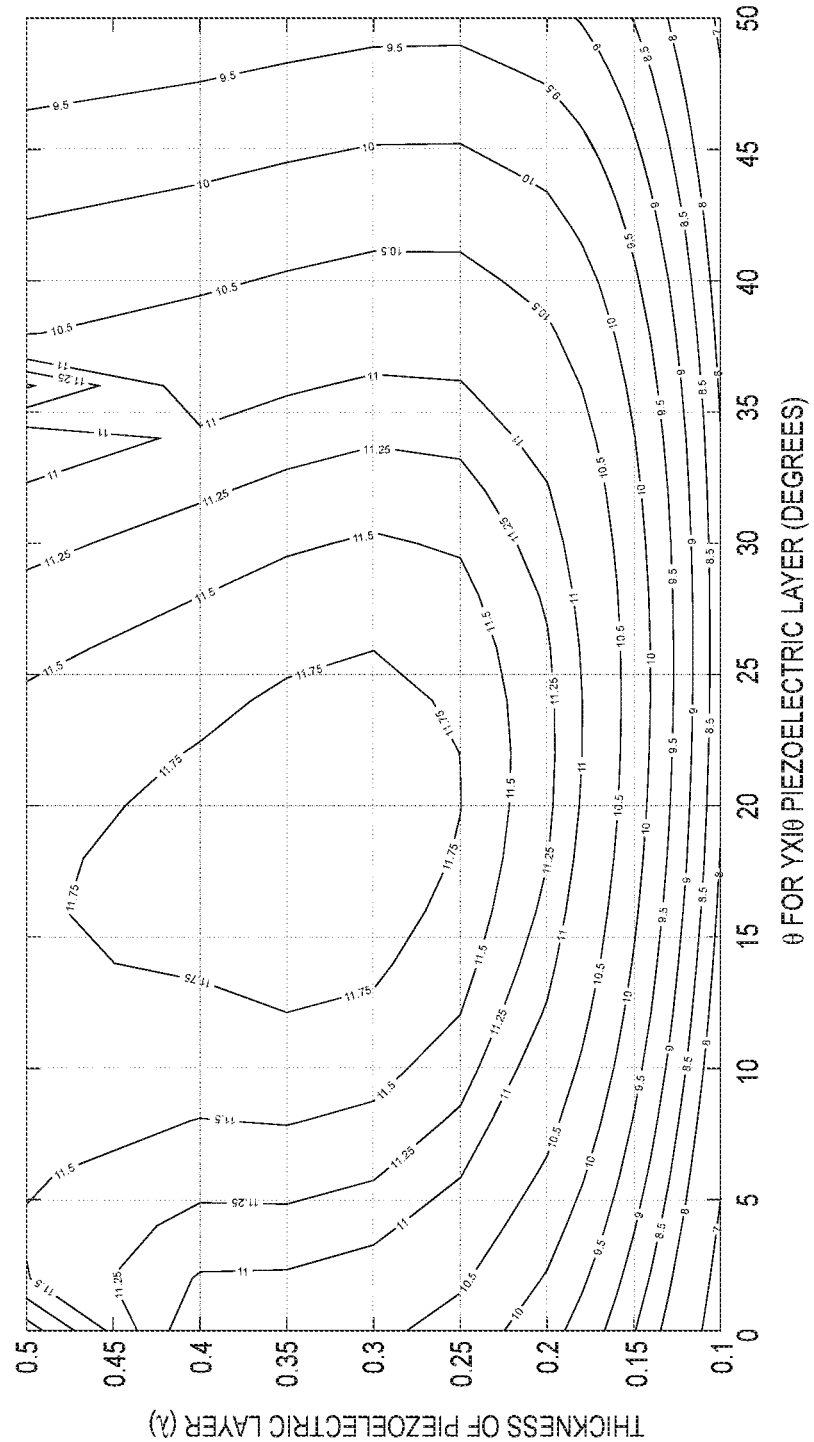
Figure 6D:
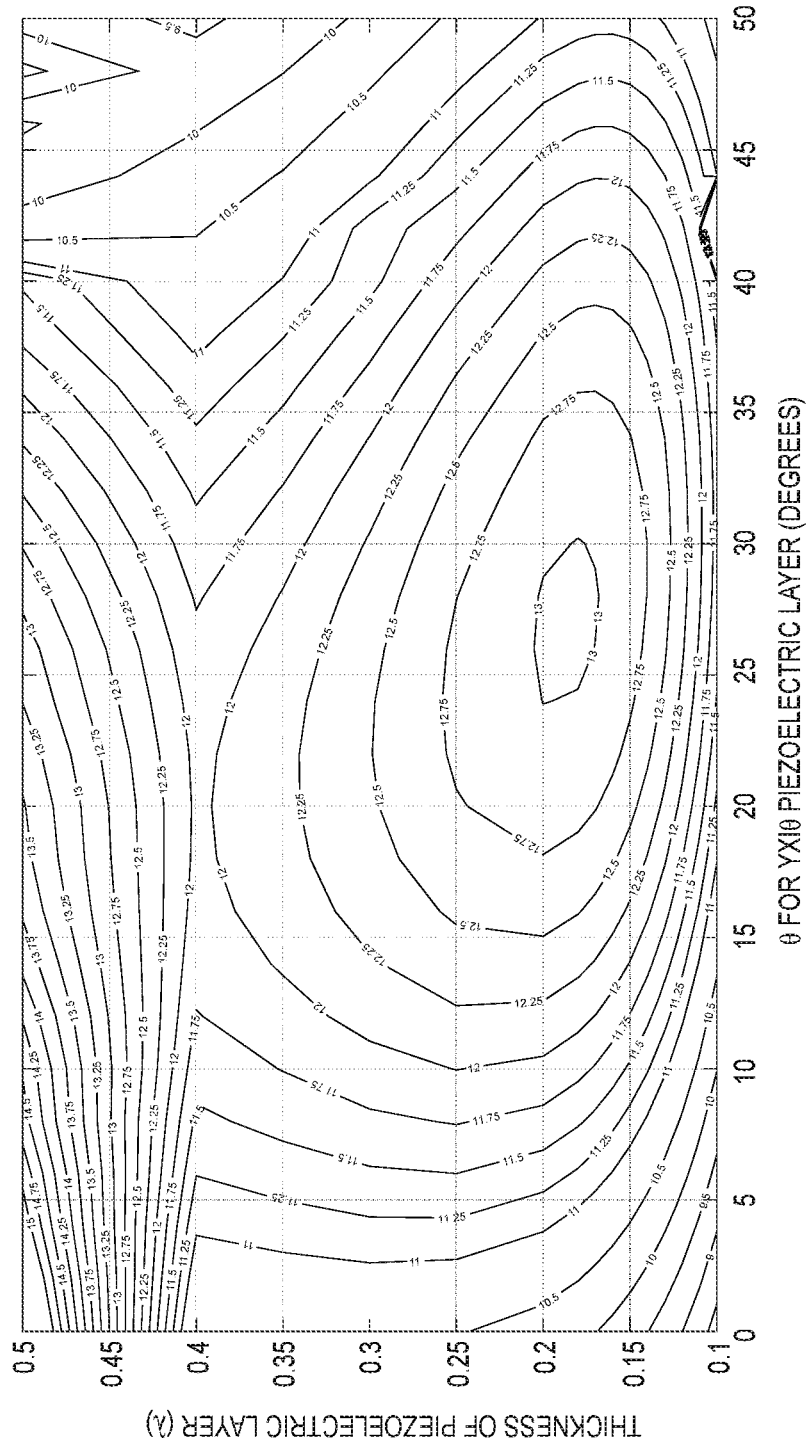
Figure 6E:
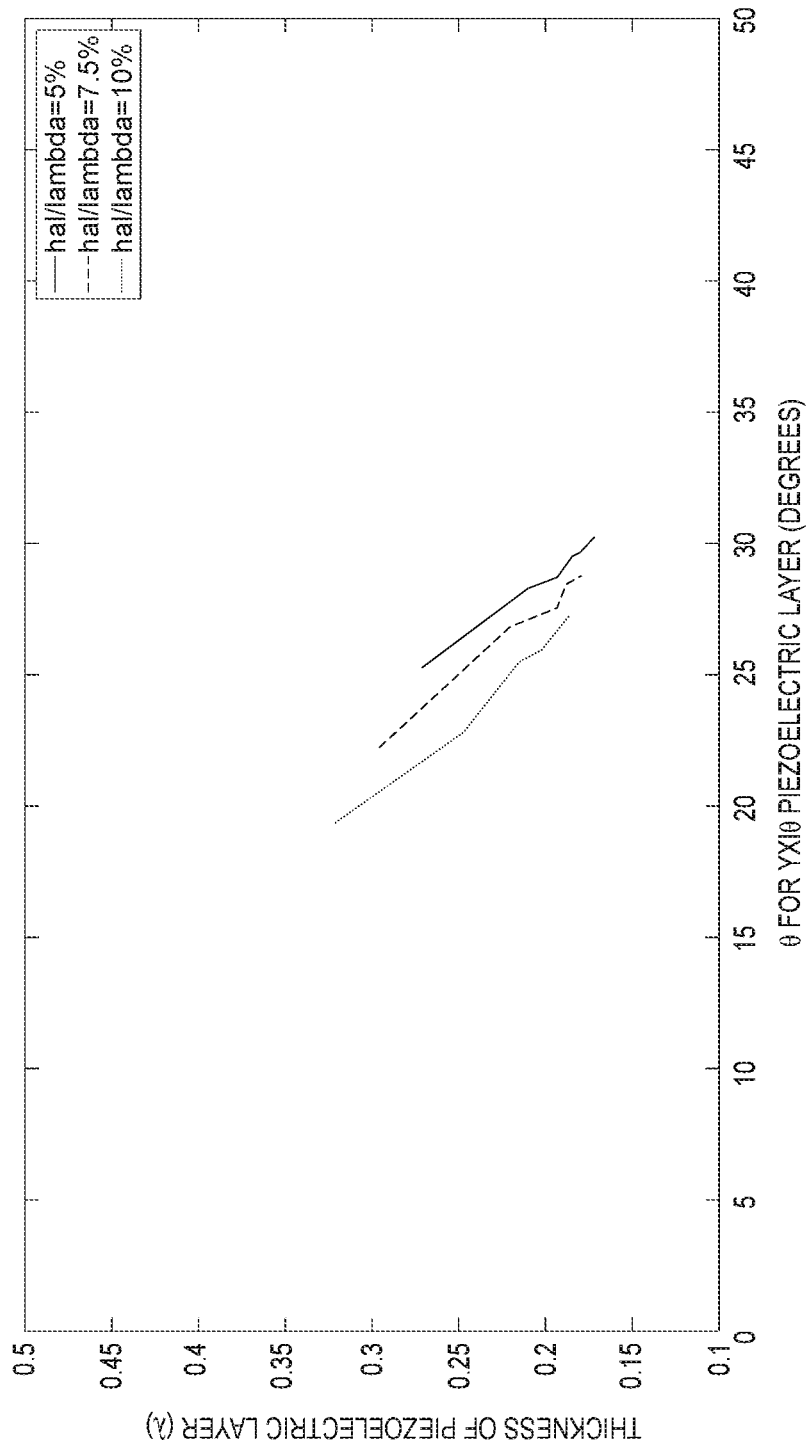
Figure 6F:
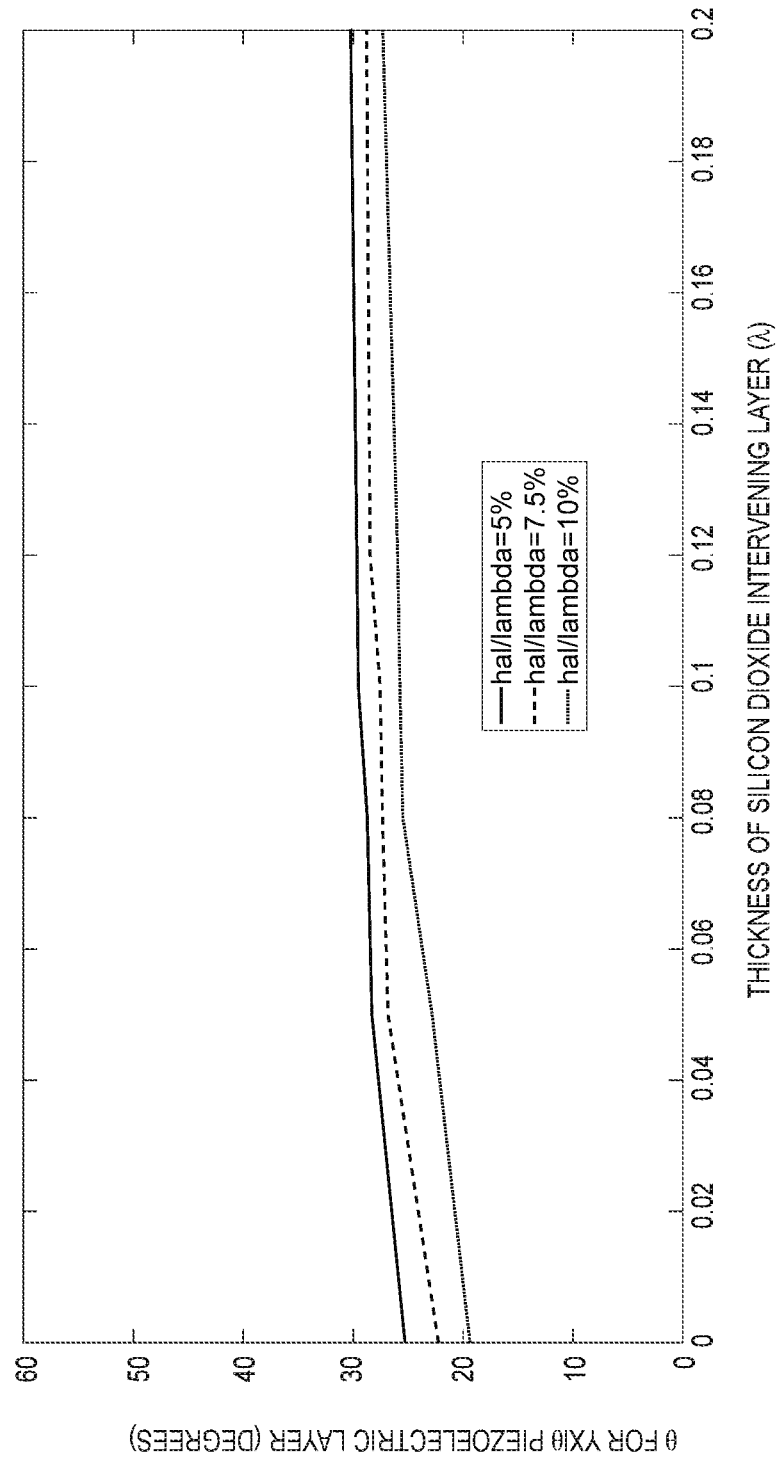
Figure 6G:
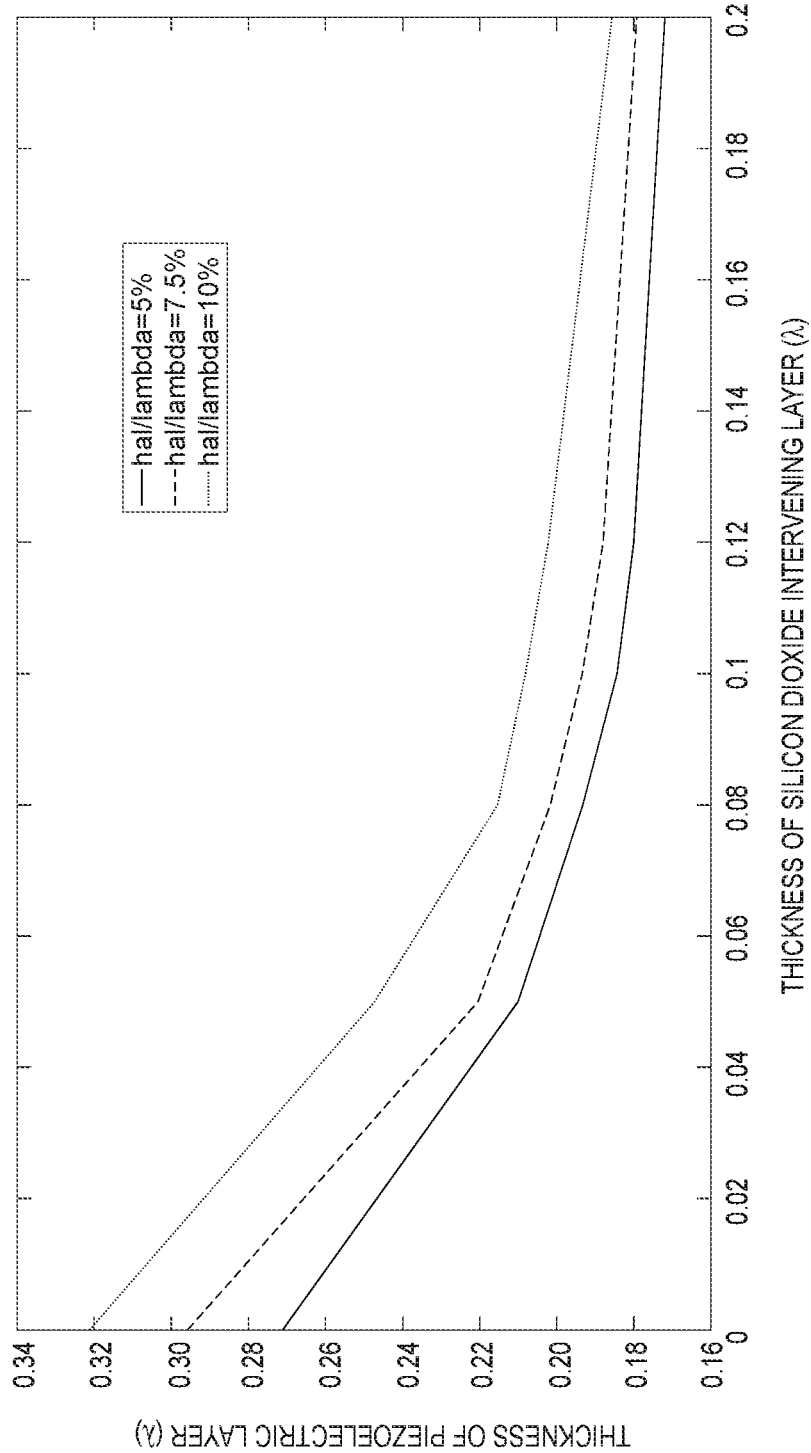
Figure 6H:
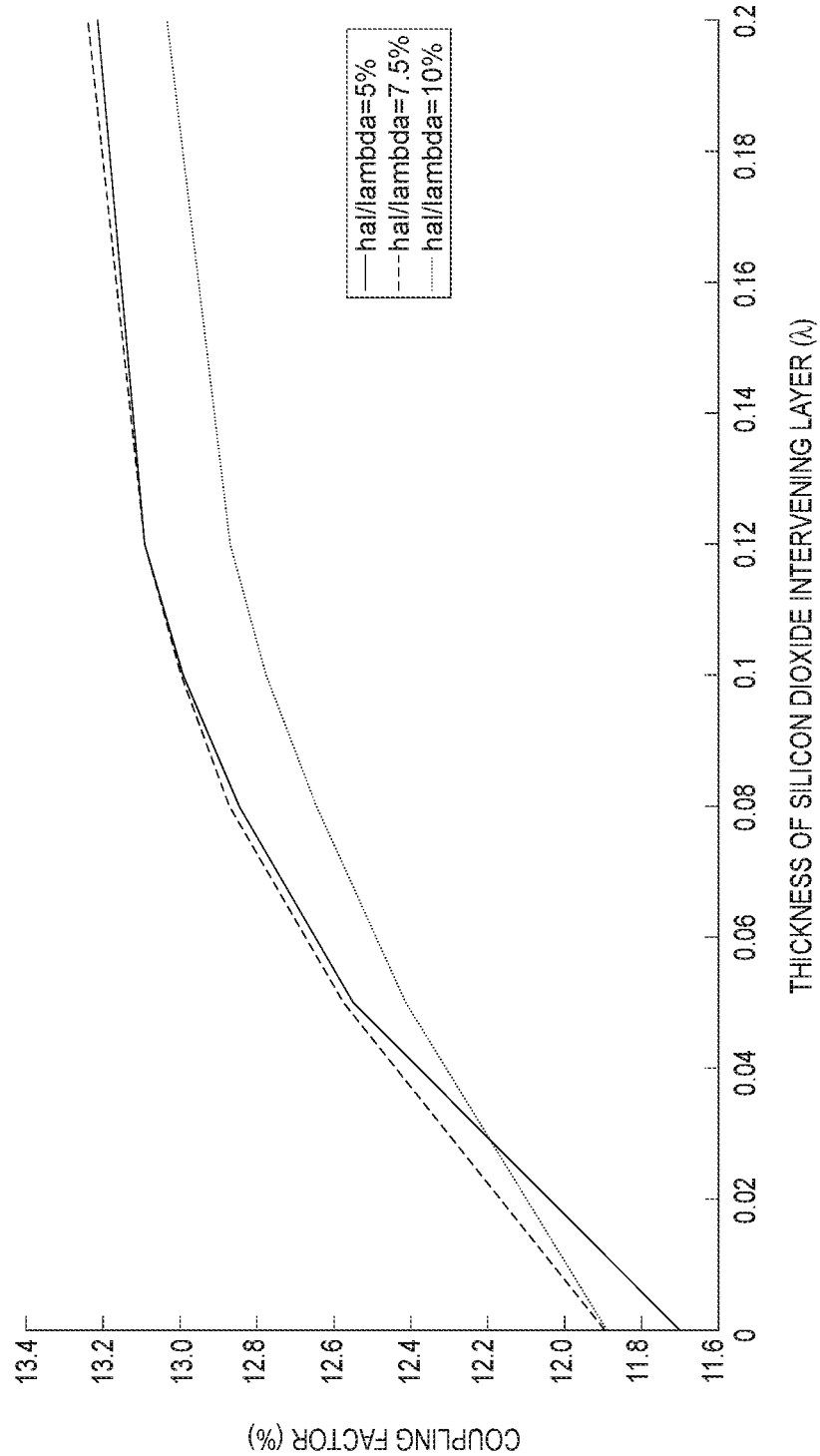
Figure 6I:
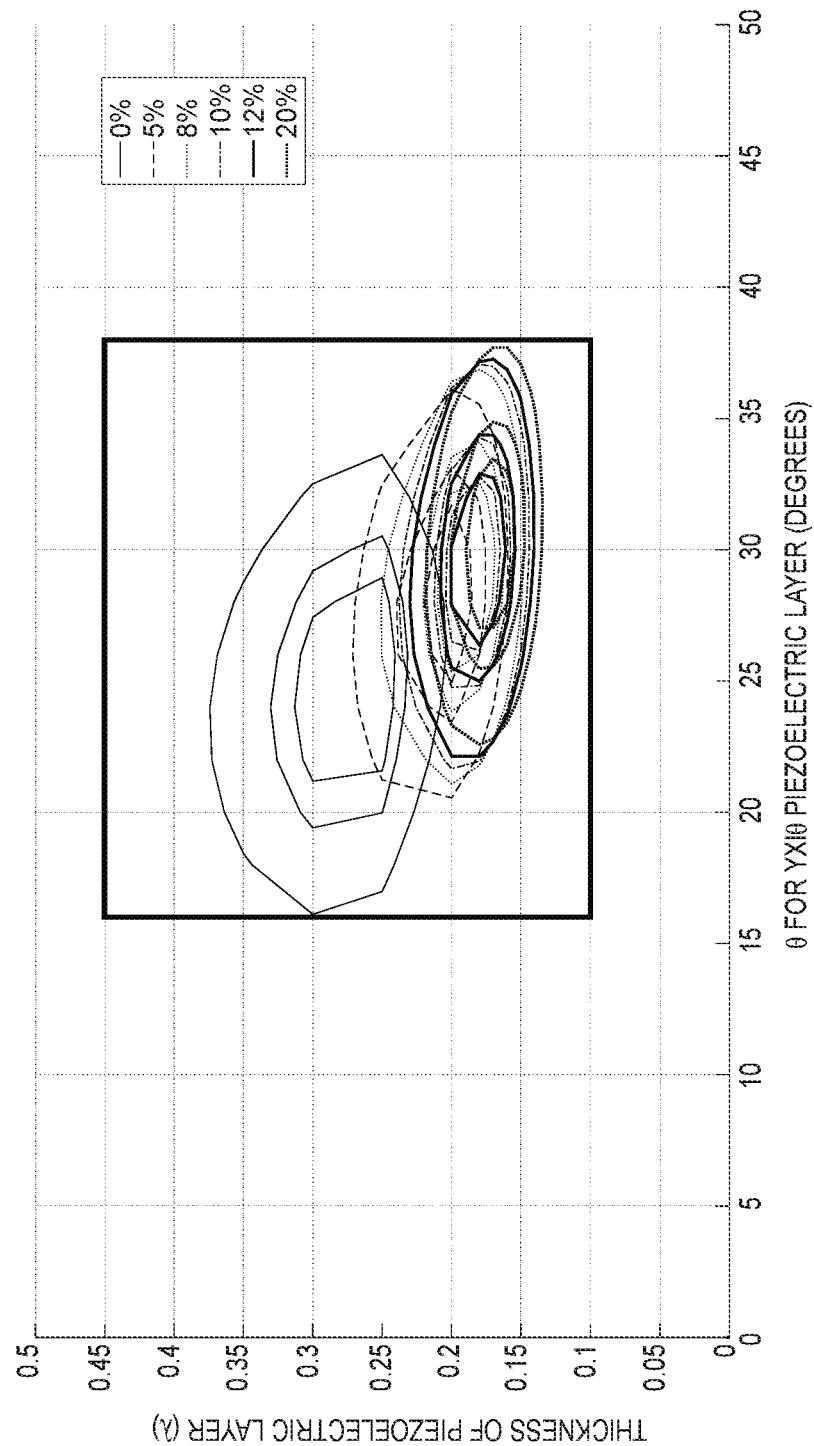
Figure 6J:
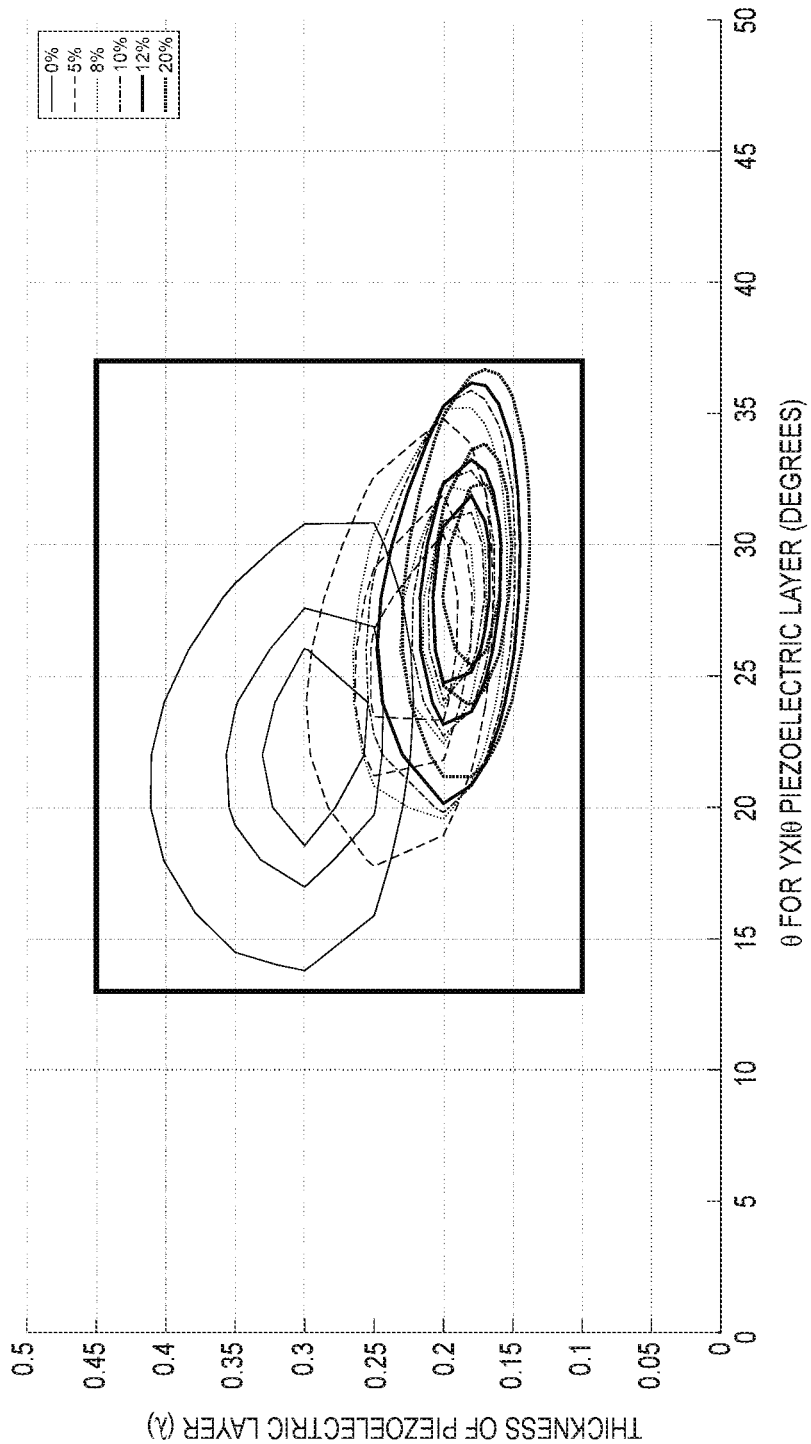
Figure 6K:
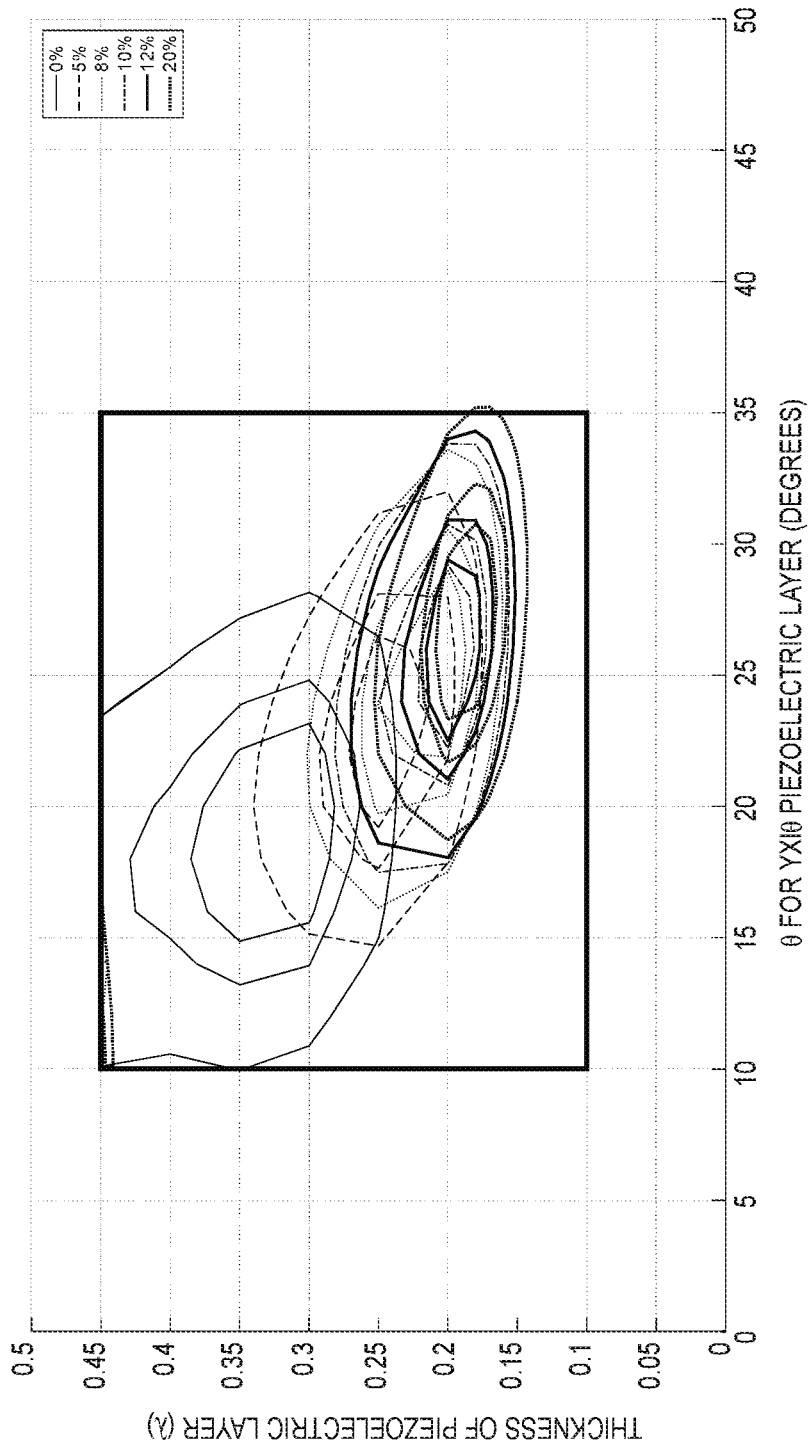
Figure 6L:
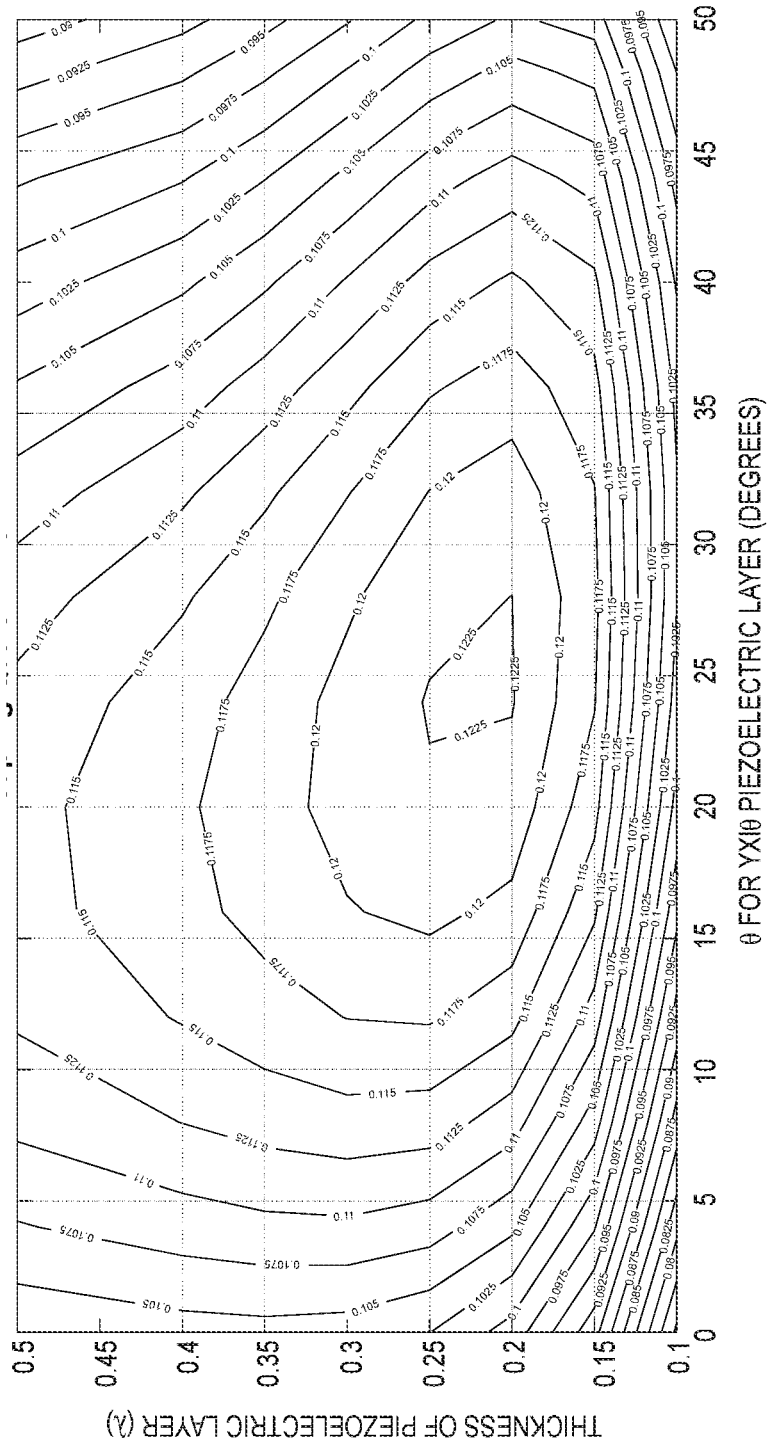
Figure 6M:
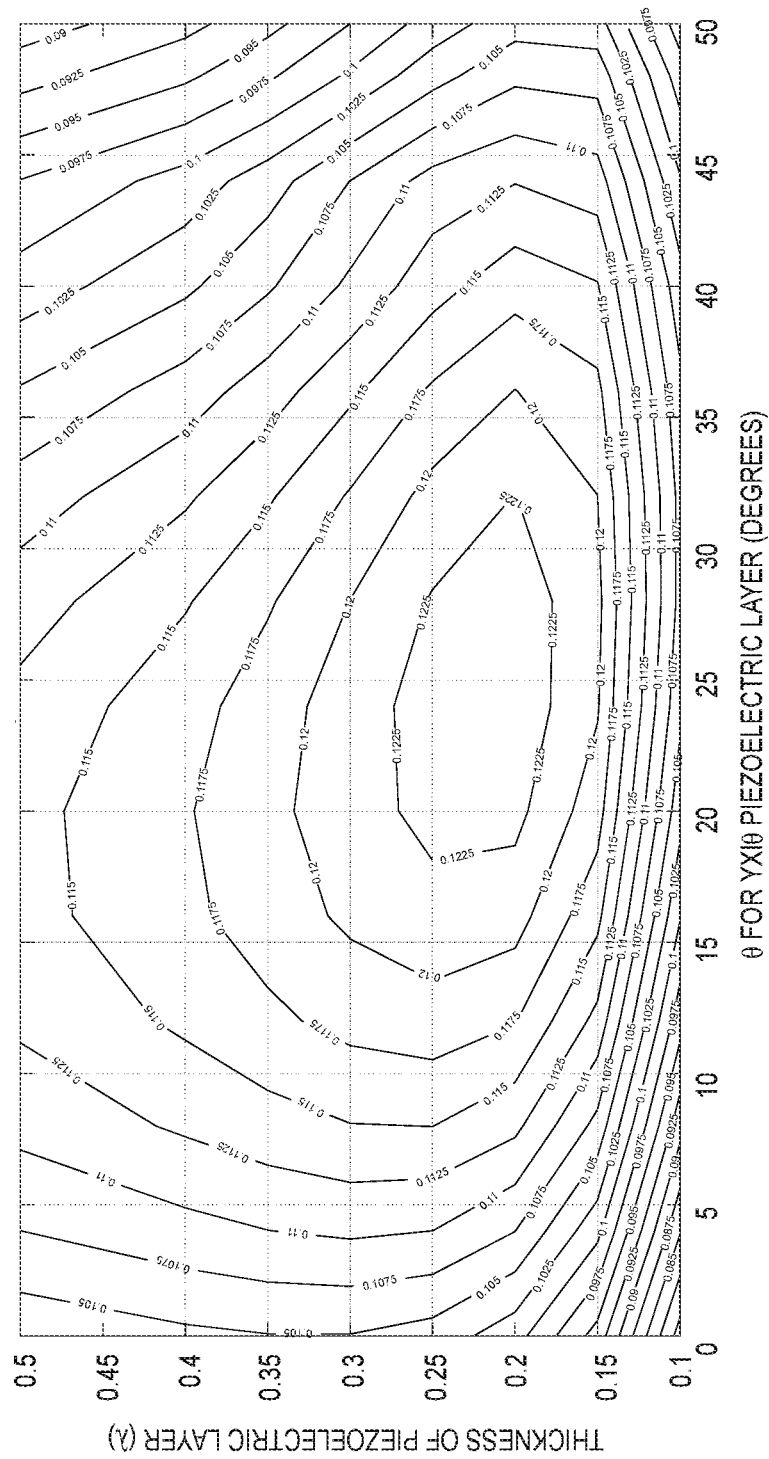
Figure 6N:
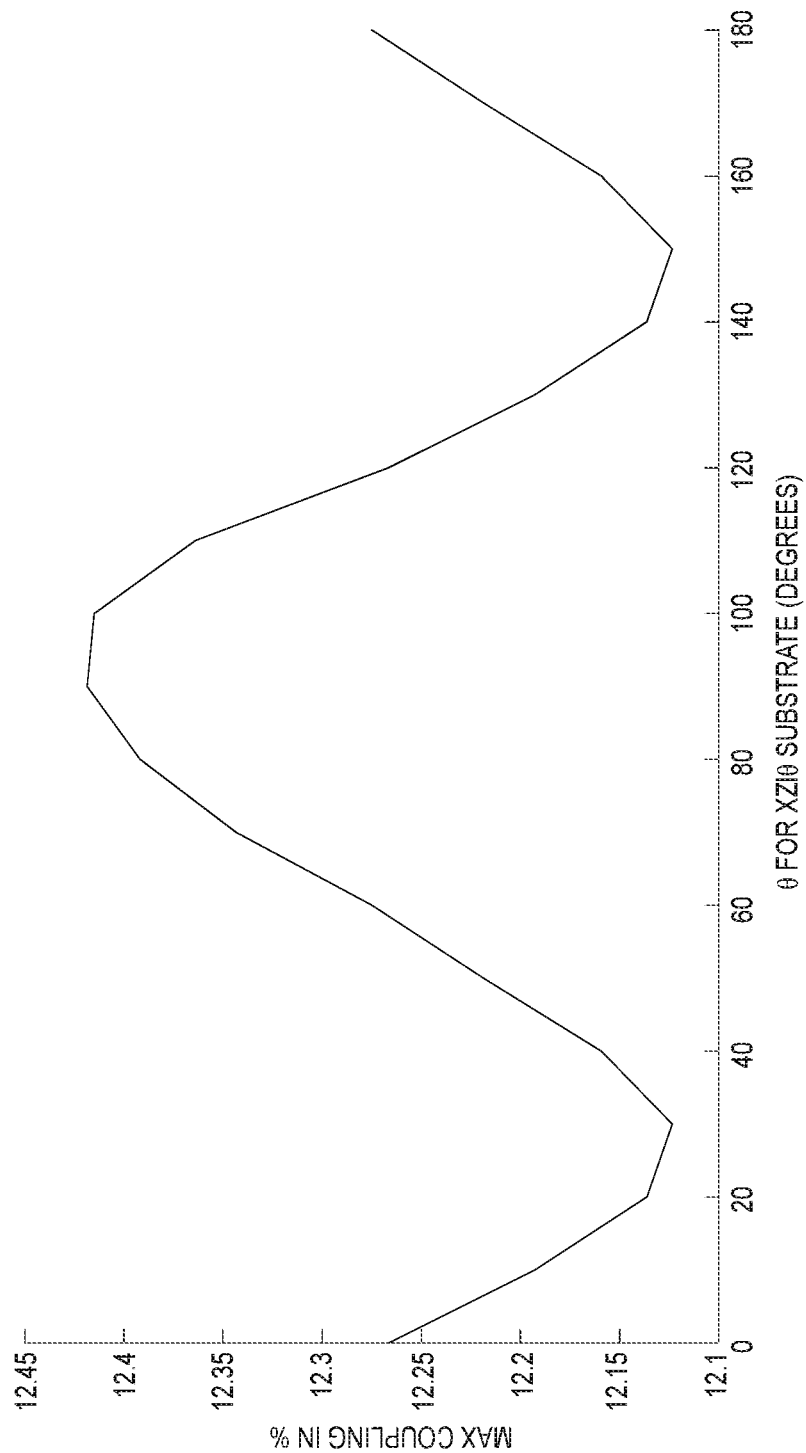
Figure 6O:
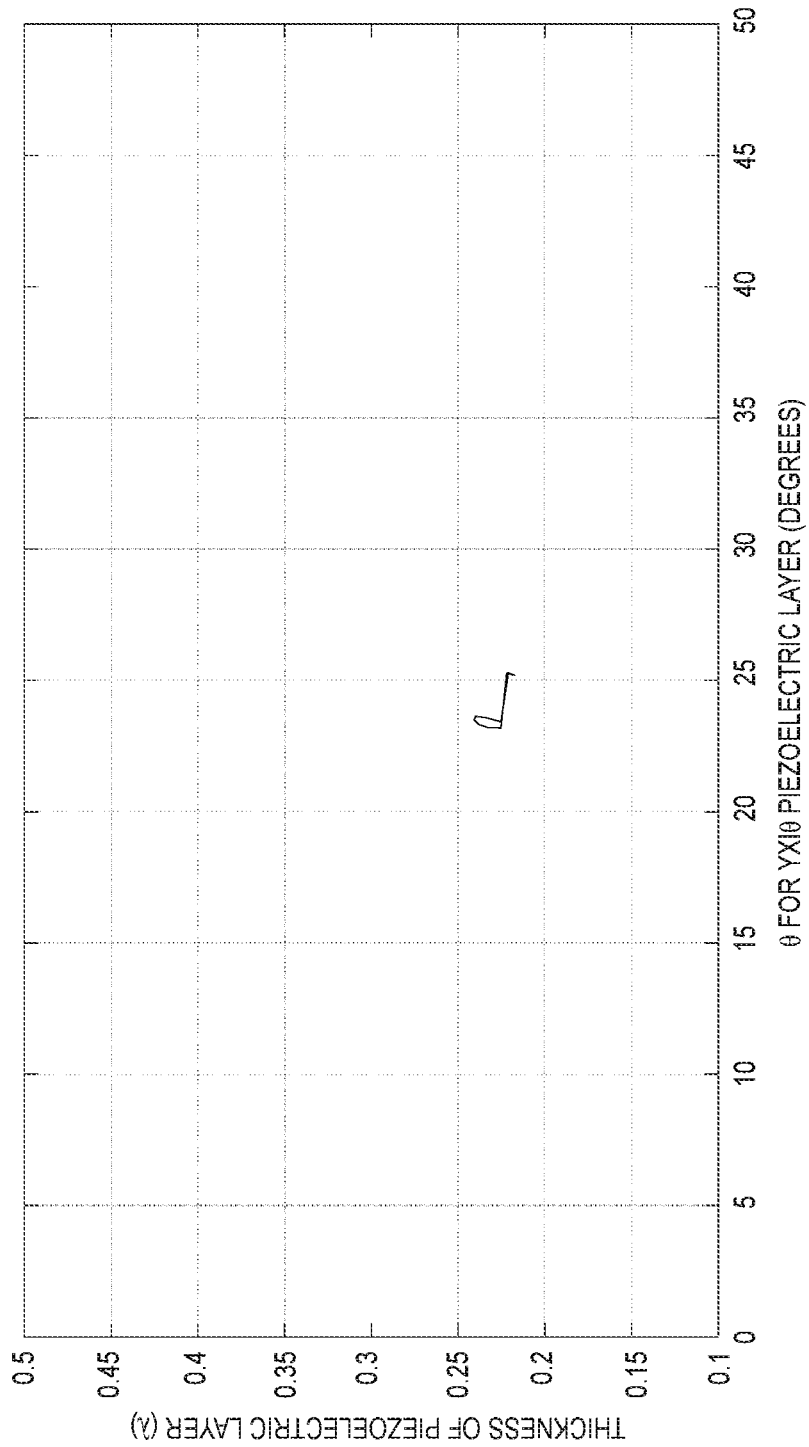
Figure 6P:
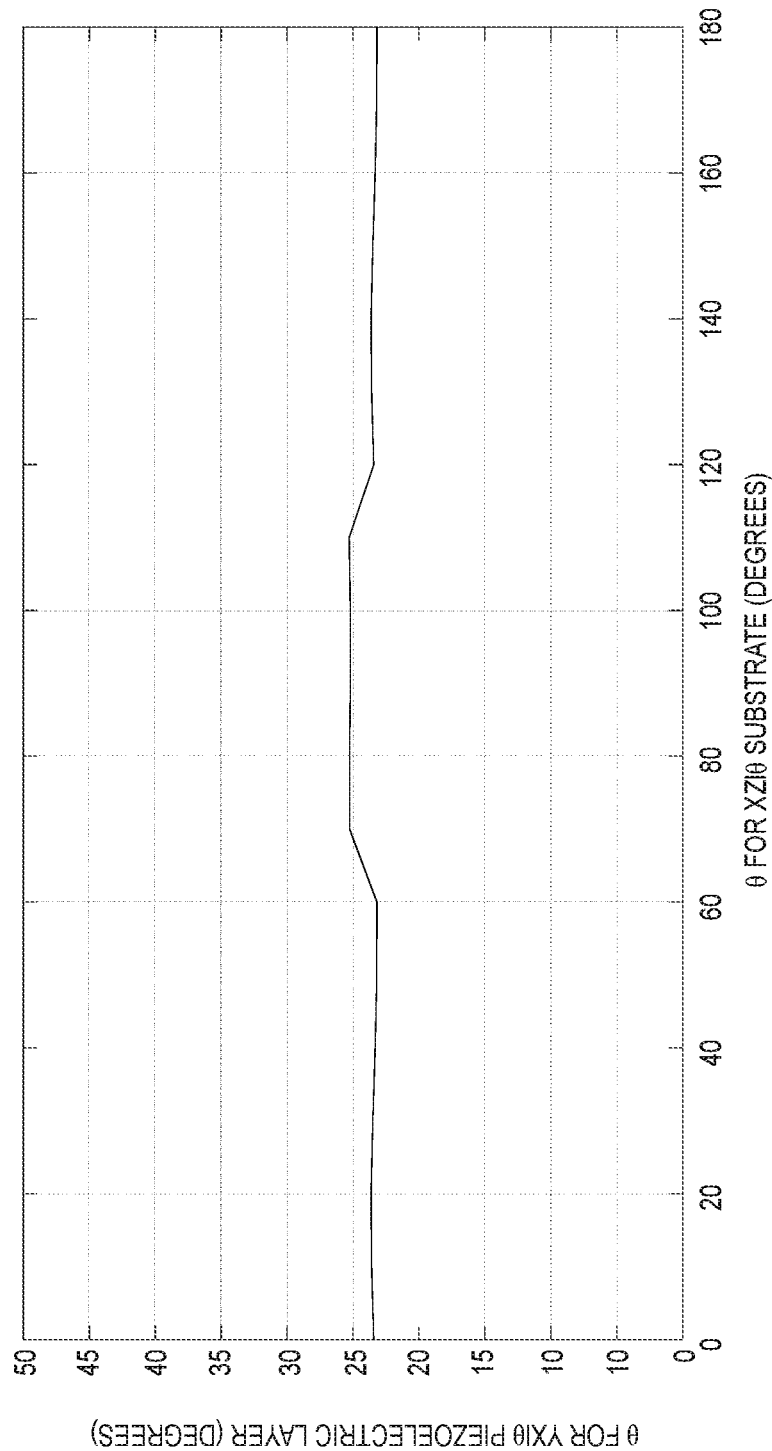
Figure 6Q:
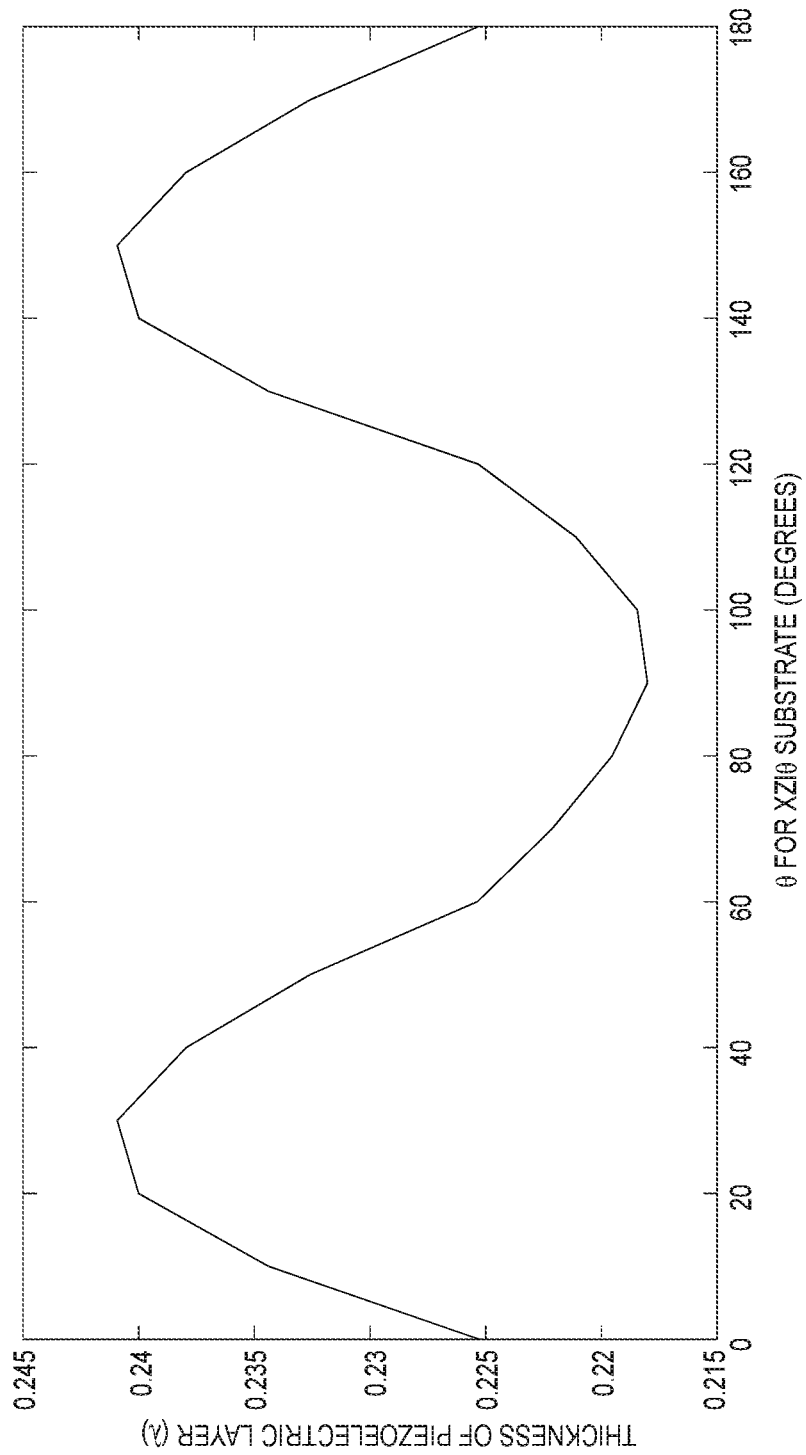
Figure 6R:
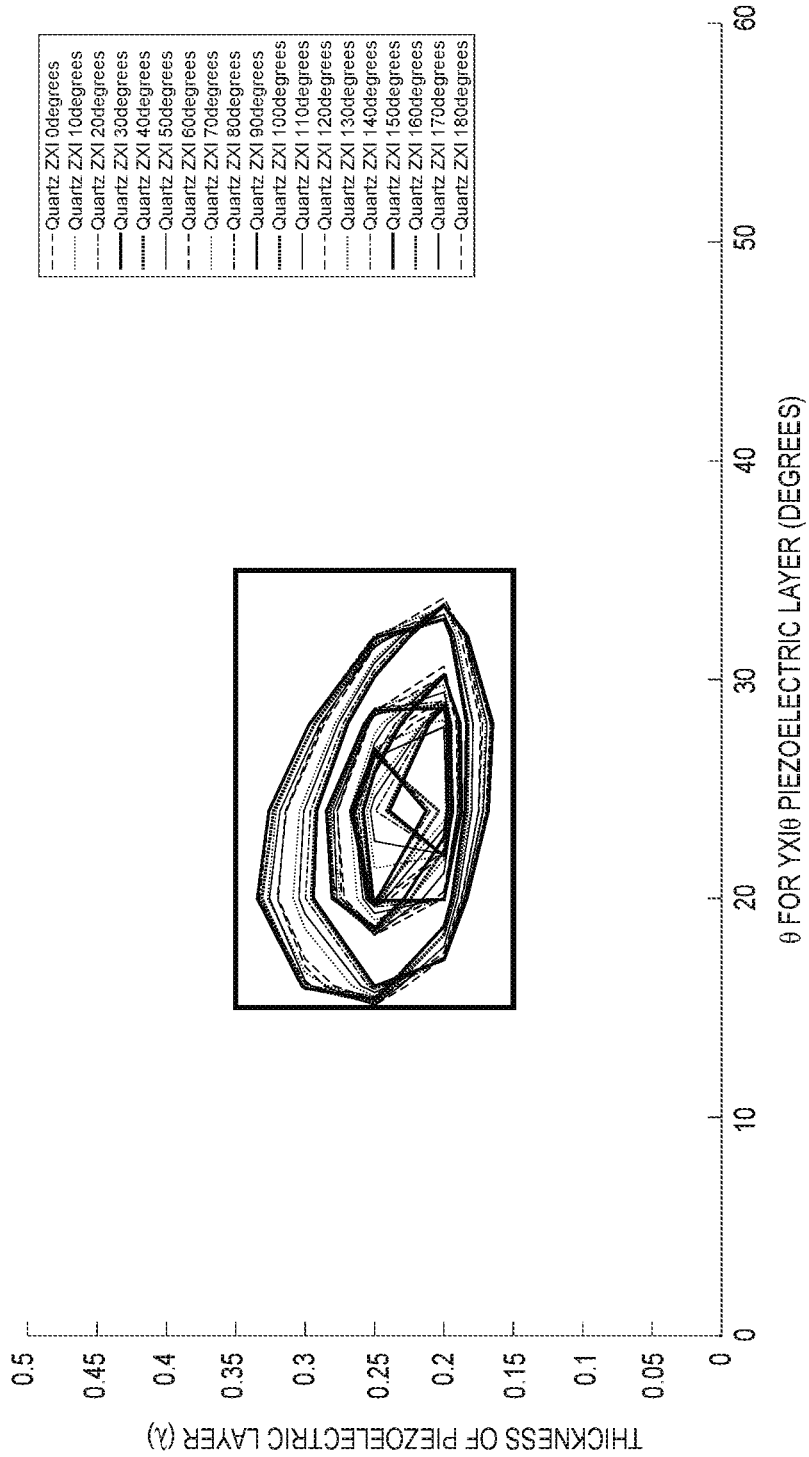

FIGS. 6A through 6R are graphs illustrating the simulated performance of a guided acoustic wave device according to various embodiments of the present disclosure. FIG. 6A is a graph illustrating a relationship between a thickness of the piezoelectric layer 14 measured in wavelengths with respect to λ, the angle of Θ for a YXlΘ piezoelectric layer 14 measured in degrees, and the coupling factor measured in percent of the guided acoustic wave device 10 when the substrate 12 is Si(111), a thickness of metal in the interdigital transducer 16 is 0.05λ, the metal is aluminum, and there is no intervening layer 30 between the substrate 12 and the piezoelectric layer 14. The numbers in each one of the contours in the graph represent the coupling factor of the guided acoustic wave device 10 in percent. As shown, the best coupling is obtained when Θ≈20° to 30°.

FIG. 6B is a graph illustrating a relationship between a thickness of the piezoelectric layer 14 measured in wavelengths with respect to λ, the angle of Θ for a YXlΘ piezoelectric layer 14 measured in degrees, and the coupling factor measured in percent of the guided acoustic wave device 10 when the substrate 12 is Si(111), a thickness of the interdigital transducer 16 is 0.05λ and comprises aluminum, and there is a silicon dioxide intervening layer 30 between the substrate 12 and the piezoelectric layer 14 with a thickness of 0.20λ. The numbers in each one of the contours in the graph represent the coupling factor of the guided acoustic wave device 10 in percent. As shown, the best coupling is obtained when Θ≈30°.

FIG. 6C is a graph illustrating a relationship between a thickness of the piezoelectric layer 14 measured in wavelengths with respect to λ, the angle of Θ for a YXlΘ piezoelectric layer 14 measured in degrees, and the coupling factor measured in percent of the guided acoustic wave device 10 when the substrate 12 is Si(111), a thickness of the interdigital transducer 16 is 0.10λ, and there is no intervening layer 30 between the substrate 12 and the piezoelectric layer 14. The numbers in each one of the contours in the graph represent the coupling factor of the guided acoustic wave device 10 in percent. As shown, the best coupling is obtained when Θ≈18°.

FIG. 6D is a graph illustrating a relationship between a thickness of the piezoelectric layer 14 measured in wavelengths with respect to λ, the angle of Θ for a YXlΘ piezoelectric layer 14 measured in degrees, and the coupling factor measured in percent of the guided acoustic wave device 10 when the substrate 12 is Si(111), a thickness of the interdigital transducer 16 is 0.10λ, and there is a silicon dioxide intervening layer 30 between the substrate 12 and the piezoelectric layer 14 with a thickness of 0.20λ. The numbers in each one of the contours in the graph represent the coupling factor of the guided acoustic wave device 10 in percent. As shown, the best coupling is obtained when Θ≈27°.

FIG. 6E is a graph illustrating a relationship between a thickness of the piezoelectric layer 14 measured in wavelengths with respect to λ, the angle of Θ for a YXlΘ piezoelectric layer 14 measured in degrees, and a maximum coupling coefficient when the substrate 12 is Si(111) and a thickness of the interdigital transducer 16 is 0.05λ, 0.075λ, and 0.10λ. A separate line is shown for each thickness of the interdigital transducer 16. The lines shown indicate the range of thicknesses for the piezoelectric layer 14 and the angles for Θ over which the guided acoustic wave device 10 experiences its maximum coupling coefficient at each thickness of the interdigital transducer 16.

FIG. 6F is a graph illustrating a relationship between the angle of Θ measured in degrees, a thickness of a silicon dioxide intervening layer 30 measured in wavelengths with respect to λ, and a maximum coupling coefficient when the substrate 12 is Si(111) and a thickness of the interdigital transducer 16 is 0.05λ, 0.075λ, and 0.10λ. A separate line is shown for each thickness of the interdigital transducer 16. The lines shown indicate the range of angles for Θ and the thicknesses of the intervening layer 30 of silicon dioxide over which the guided acoustic wave device 10 experiences its maximum coupling coefficient at each thickness of the interdigital transducer 16.

FIG. 6G is a graph illustrating a relationship between a thickness of the piezoelectric layer 14 measured in wavelengths with respect to), a thickness of a silicon dioxide intervening layer 30 measured in wavelengths with respect to) λ, and a maximum coupling coefficient when the substrate 12 is Si(111) and a thickness of the interdigital transducer 16 is 0.05λ, 0.075λ, and 0.10λ. A separate line is shown for each thickness of the interdigital transducer 16. The lines shown indicate the range of thicknesses for the piezoelectric layer 14 and the silicon oxide intervening layer 30 over which the guided acoustic wave device 10 experiences its maximum coupling coefficient at each thickness of the interdigital transducer 16.

FIG. 6H is a graph illustrating a relationship between a coupling factor measured in percent and a thickness of a silicon dioxide intervening layer 30 when the substrate 12 is Si(111) and a thickness of the interdigital transducer 16 is 0.05λ, 0.075λ, and 0.10Δ. A separate line is shown for each thickness of the interdigital transducer 16. The lines show the relationship between the thickness of the intervening layer 30 of silicon dioxide and the coupling coefficient.

FIG. 6I is a graph illustrating a relationship between a thickness of the piezoelectric layer 14 in wavelengths with respect to λ, the angle of Θ for a YXlΘ piezoelectric layer 14 measured in degrees, and a maximum coupling coefficient when the substrate 12 is Si(111) and a thickness of the interdigital transducer 16 is 0.05λ, for a variety of thicknesses of a silicon dioxide intervening layer 30. Each set of contour plots in the graph illustrates a max coupling coefficient with a 0.05% margin (smallest), a 0.1% margin (middle), and a 0.25% margin (largest) for a different thickness of the intervening layer 30 of silicon dioxide. As shown, the thickness of the piezoelectric layer 14 and the angle of Θ to obtain maximum coupling is different for each thickness of the intervening layer 30 of silicon dioxide.

FIG. 6J is a graph illustrating the same relationship as FIG. 6I, but where a thickness of the interdigital transducer 16 is 0.075λ.

FIG. 6K is a graph illustrating the same relationship as FIGS. 6I and 6J, but where a thickness of the interdigital transducer 16 is 0.10λ.

FIG. 6L is a graph illustrating a relationship between a thickness of the piezoelectric layer 14 measured in wavelengths with respect to λ, the angle of Θ for a YXlΘ piezoelectric layer 14 measured in degrees, and the coupling factor measured in percent of the guided acoustic wave device 10 when the substrate 12 is quartz XZ, a thickness of the interdigital transducer 16 is 0.05λ, and there is no intervening layer 30 between the substrate 12 and the piezoelectric layer 14. The numbers in each one of the contours in the graph represent the coupling factor of the guided acoustic wave device 10 in percent. As shown, the best coupling is obtained when Θ≈25°.

FIG. 6M is a graph illustrating a relationship between a thickness of the piezoelectric layer 14 measured in wavelengths with respect to λ, the angle of Θ measured in degrees, and the coupling factor measured in percent of the guided acoustic wave device 10 when the substrate 12 is quartz, a thickness of the interdigital transducer 16 is 0.05λ, and there is no intervening layer 30 between the substrate 12 and the piezoelectric layer 14. The numbers in each one of the contours in the graph represent the coupling factor of the guided acoustic wave device 10 in percent. As shown, the best coupling is obtained when Θ≈24°.

FIG. 6N is a graph illustrating a relationship between a coupling coefficient measured in percentage and an orientation of a quartz substrate 12, specifically the angle of Θ in degrees for a quartz ZXlΘ substrate 12. As shown, the maximum coupling coefficient occurs between 80° and 100°.

FIG. 6O is a graph illustrating a relationship between a thickness of the piezoelectric layer 14 in wavelengths with respect to λ and the angle of Θ for a YXlΘ piezoelectric layer 14 measured in degrees, wherein the substrate 12 is quartz XZlΘ and Θ varies from 0° to 180°.

FIG. 6P is a graph illustrating a relationship between the angle of Θ for a YXlΘ piezoelectric layer 14 measured in degrees, the angle of Θ for a ZXlΘ quartz substrate 12, and a maximum coupling coefficient of the guided acoustic wave device 10. The line shows the angles for the piezoelectric layer 14 and the substrate 12 that achieve a maximum coupling coefficient for the guided acoustic wave device 10.

FIG. 6Q is a graph illustrating a relationship between a thickness of the piezoelectric layer 14 measured in wavelengths with respect to λ, the angle of Θ for a XZlΘ quartz substrate 12 measured in degrees, and a maximum coupling coefficient of the acoustic wave device 10. The line shows the values for the thickness of the piezoelectric layer 14 and the orientation of the quartz substrate 12 that achieve the maximum coupling coefficient for the guided acoustic wave device 10.

FIG. 6R is a graph illustrating a relationship between a thickness of the piezoelectric layer 14, the angle of Θ for a XYlΘ piezoelectric layer 14 measured in degrees, and a maximum coupling coefficient for the guided acoustic wave device 10. Each set of contour plots in the graph illustrates a max coupling coefficient with a 0.05% margin (smallest), a 0.1% margin (middle), and a 0.25% margin (largest) for a different orientation of a ZXlΘ quartz substrate.

Those skilled in the art will recognize improvements and modifications to the preferred embodiments of the present disclosure. All such improvements and modifications are considered within the scope of the concepts disclosed herein and the claims that follow.

What is claimed is:
1. A guided acoustic wave device comprising:
   a substrate comprising one of quartz and silicon;
   a lithium tantalate layer on the substrate, the lithium tantalate layer having a crystalline orientation defined by (YXl)Θ°, where Θ is between 10° and 37°; and
   a transducer on the lithium tantalate layer.
2. The guided acoustic wave device of claim 1 wherein the transducer is an interdigital transducer comprising:

a first comb electrode comprising a first bus bar and a first plurality of electrode fingers extending transversely from the first bus bar; and a second comb electrode comprising a second bus bar and a second plurality of electrode fingers extending transversely from the second bus bar such that:

the first bus bar is parallel to the second bus bar;

the first plurality of electrode fingers extend from the first bus bar towards the second bus bar;

the second plurality of electrode fingers extend from the second bus bar towards the first bus bar; and the first plurality of electrode fingers are interleaved with the second plurality of electrode fingers.

3. The guided acoustic wave device of claim 2 wherein:

a distance between adjacent electrode fingers of one of the first comb electrode and the second comb electrode defines a center frequency wavelength ($\lambda$) of the guided acoustic wave device; and a thickness of the lithium tantalate layer is less than $2\lambda$.

4. A device according to claim 3 wherein the first comb electrode and the second comb electrode are essentially perpendicular to an X axis of the lithium tantalate layer.

5. The guided acoustic wave device of claim 3 wherein the thickness of the lithium tantalate layer is between $0.10\lambda$ and $0.45\lambda$.

6. The guided acoustic wave device of claim 5 wherein $\Theta$ is between 10° and 35°.

7. The guided acoustic wave device of claim 5 wherein $\Theta$ is between 21° and 35°.

8. The guided acoustic wave device of claim 7 wherein the thickness of the lithium tantalate layer is between $0.15\lambda$ and $0.35\lambda$.

9. The guided acoustic wave device of claim 3 wherein $\Theta$ is between 10° and 35°.

10. The guided acoustic wave device of claim 9 wherein the thickness of the lithium tantalate layer is between $0.15\lambda$ and $0.35\lambda$.

11. The guided acoustic wave device of claim 1 wherein $\Theta$ is between 10° and 35°.

12. The guided acoustic wave device of claim 11 wherein the thickness of the lithium tantalate layer is between $0.15\lambda$ and $0.35\lambda$.

13. The guided acoustic wave device of claim 3 wherein:

the substrate comprises quartz with a propagation that is close to a Z axis thereof;

the guided acoustic wave device comprises one or more dielectric layers between the substrate and the lithium tantalate layer; and the thickness of the lithium tantalate layer is between $0.15\lambda$ and $0.35\lambda$.

14. The guided acoustic wave device of claim 3 wherein:

the substrate comprises Si(111); and the guided acoustic wave device further comprises one or more silicon oxide layers between the substrate and the lithium tantalate layer.

15. The guided acoustic wave device of claim 1 wherein the substrate comprises quartz.

16. The guided acoustic wave device of claim 15 further comprising one or more dielectric layers between the substrate and the lithium tantalate layer.

17. The guided acoustic wave device of claim 1 wherein the substrate comprises Si(111).

18. The guided acoustic wave device of claim 17 further comprising one or more oxide layers between the substrate and the lithium tantalate layer.

19. The guided acoustic wave device of claim 1 wherein $\Theta$ is between 15° and 30°.

20. The guided acoustic wave device of claim 1 wherein $\Theta$ is between 10° and 35°.

21. A guided acoustic wave device comprising:

a substrate comprising one of quartz and silicon;

a lithium tantalate layer on the substrate; and an interdigital transducer on the lithium tantalate layer, wherein:

the interdigital transducer comprises a first comb electrode and a second comb electrode;

a distance between adjacent electrode fingers of one of the first comb electrode and the second comb electrode defines a center frequency wavelength ($\lambda$) of the guided acoustic wave device;

the transducer comprises a patterned metal layer having a thickness (h); and a crystalline orientation of the lithium tantalate layer is defined by $$(YXl)\theta° \text{ where } 22 - \frac{1.2h}{\lambda} \leq \Theta \leq 37 + \frac{0.6h}{\lambda} - 0.08\left(\frac{h}{\lambda}\right)^2.$$

22. The guided acoustic wave device of claim 21 further comprising one or more oxide layers between the substrate and the lithium tantalate layer.

23. The guided acoustic wave device of claim 21 wherein the substrate comprises one of (YXl)90° quartz and (111) silicon.

* * * * *

UNITED STATES PATENT AND TRADEMARK OFFICE
CERTIFICATE OF CORRECTION

PATENT NO. : 10,924,085 B2
APPLICATION NO. : 15/785760
DATED : February 16, 2021
INVENTOR(S) : Shogo Inoue and Marc Solal Page 1 of 1

It is certified that error appears in the above-identified patent and that said Letters Patent is hereby corrected as shown below:

In the Claims
Claim 23, Column 12, Line 46, replace "(YXl)90° quartz" with -- (XZl)90° quartz --.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*